United States Patent
Shapiro et al.

(10) Patent No.: US 11,689,216 B1
(45) Date of Patent: Jun. 27, 2023

(54) LOW GATE-COUNT GENERALIZED CONCATENATED CODE (GCC) BY ONLINE CALCULATION OF SYNDROMES INSTEAD OF BUFFER

(71) Applicant: SAMSUNG ELECTRONICS CO., LTD., Suwon-si (KR)

(72) Inventors: Dikla Shapiro, Suwon-si (KR); Amit Berman, Suwon-si (KR); Ariel Doubchak, Suwon-Si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/690,124

(22) Filed: Mar. 9, 2022

(51) Int. Cl.
*H03M 13/00* (2006.01)
*H03M 13/11* (2006.01)
*H03M 13/15* (2006.01)

(52) U.S. Cl.
CPC ..... *H03M 13/1108* (2013.01); *H03M 13/152* (2013.01); *H03M 13/1515* (2013.01); *H03M 13/1575* (2013.01)

(58) Field of Classification Search
CPC ......... H03M 13/1108; H03M 13/1515; H03M 13/151; H03M 13/152; H03M 13/1575; H03M 13/1105
See application file for complete search history.

(56) References Cited

U.S. PATENT DOCUMENTS

| | | | | |
|---|---|---|---|---|
| 5,996,105 A * | 11/1999 | Zook | ................... | H03M 13/151 714/755 |
| 6,192,499 B1 * | 2/2001 | Yang | ................... | G11B 20/1833 |
| 6,363,511 B1 * | 3/2002 | Massoudi | ......... | H03M 13/2909 714/755 |
| 6,738,942 B1 * | 5/2004 | Sridharan | ............. | H03M 13/29 714/755 |
| 7,600,177 B2 * | 10/2009 | Qian | ................... | H03M 13/157 714/755 |
| 7,624,330 B2 * | 11/2009 | Juluri | ................ | H03M 13/1515 714/755 |

* cited by examiner

Primary Examiner — Esaw T Abraham
(74) Attorney, Agent, or Firm — Sughrue Mion, PLLC

(57) ABSTRACT

A device for decoding a generalized concatenated code (GCC) codeword includes: a buffer; and at least one processor configured to: obtain the GCC codeword, calculate a plurality of inner syndromes based on a plurality of frames; calculate a plurality of sets of delta syndromes based on the frames; determine a plurality of outer syndromes based on the sets of delta syndromes; store the inner syndromes and the outer syndromes in a buffer; perform inner decoding on the frames based on the inner syndromes stored in the buffer; update at least one outer syndrome stored in the buffer based on a result of the inner decoding; perform outer decoding on the frames based on the updated at least one outer syndrome; and obtain decoded information bits corresponding to the GCC codeword based on a result of the inner decoding and the result of the outer decoding.

20 Claims, 15 Drawing Sheets

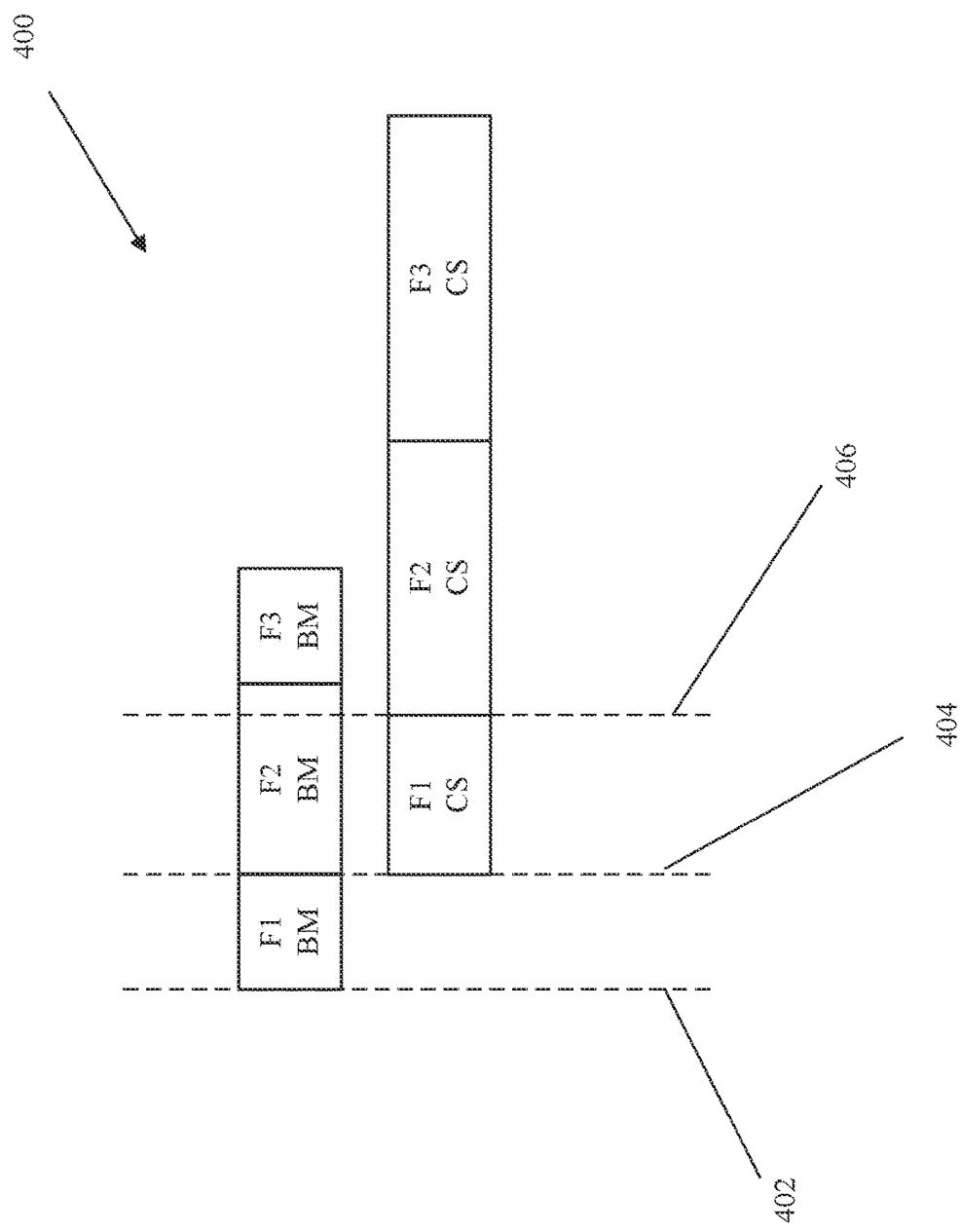

LOW GATE-COUNT GENERALIZED CONCATENATED CODE (GCC) BY ONLINE CALCULATION OF SYNDROMES INSTEAD OF BUFFER

BACKGROUND

1. Field

Apparatuses and methods consistent with embodiments relate to a process for performing error correction coding, more particularly a process for decoding a generalized concatenated code.

2. Description of Related Art

Data storage components may use error correction codes (ECC) to correct data corruption which may occur in a memory. Some types of ECC coding, for example ECC coding using a generalized concatenated code (GCC) coding scheme, may involve resource-intensive operations such as syndrome calculation which may reduce a throughput in a decoding phase.

Therefore, in order to improve throughput, there is a need for GCC decoding procedures that reduce a burden of syndrome calculation in the decoding phase.

SUMMARY

According to embodiments, a storage system includes a storage device configured to store a plurality of generalized concatenated code (GCC) codewords; a buffer; and at least one processor configured to implement an input processing module, a decoder module, and an output processing module, wherein the input processing module is configured to: obtain a GCC codeword from the storage device, wherein a GCC codeword of the plurality of GCC codewords comprises a plurality of frames arranged according to a Super Bose-Chaudhuri-Hocquenghem (SBCH) coding scheme; calculate a plurality of Bose-Chaudhuri-Hocquenghem (BCH) syndromes based on the plurality of frames; calculate a plurality of sets of delta syndromes based on the plurality of frames; determine a plurality of Reed-Solomon (RS) syndromes based on the plurality of sets of delta syndromes; and store the plurality of BCH syndromes and the plurality of RS syndromes in the buffer, wherein the decoder module is configured to: obtain the plurality of BCH syndromes and the plurality of RS syndromes from the buffer; perform BCH decoding on the plurality of frames based on the plurality of BCH syndromes; and perform RS decoding on the plurality of frames based on the plurality of RS syndromes and a result of the BCH decoding, and wherein the output processing module is configured to obtain decoded information bits corresponding to the GCC codeword based on a result of the RS decoding and the result of the BCH decoding.

According to embodiments, a device for decoding a generalized concatenated code (GCC) codeword includes a buffer; and at least one processor configured to: obtain the GCC codeword, wherein the GCC codeword includes a plurality of frames encoded according to an inner coding scheme and arranged as a plurality of rows, and wherein each column of a plurality of columns corresponding to the plurality of rows is encoded according to an outer coding scheme; calculate a plurality of inner syndromes based on the plurality of frames, wherein the plurality of inner syndromes correspond to the inner coding scheme; calculate a plurality of sets of delta syndromes based on the plurality of frames; determine a plurality of outer syndromes based on the plurality of sets of delta syndromes, wherein the plurality of outer syndromes correspond to the outer coding scheme; store the plurality of inner syndromes and the plurality of outer syndromes in a buffer; perform inner decoding on the plurality of frames according to the inner coding scheme based on the plurality of inner syndromes stored in the buffer; update at least one outer syndrome of the plurality of outer syndromes stored in the buffer based on a result of the inner decoding; and perform outer decoding on the plurality of frames according to the outer coding scheme based on the updated at least one outer syndrome; and obtain decoded information bits corresponding to the GCC codeword based on a result of the inner decoding and the result of the outer decoding.

According to embodiments, a method of controlling a storage system, is executed by at least one processor and includes: obtaining, by an input processing module implemented by the at least one processor, a generalized concatenated code (GCC) codeword from a storage device, wherein the GCC codeword includes a plurality of frames arranged according to a Super Bose-Chaudhuri-Hocquenghem (SBCH) coding scheme; calculating, by the input processing module, a plurality of Bose-Chaudhuri-Hocquenghem (BCH) syndromes based on the plurality of frames; calculating, by the input processing module, a plurality of sets of delta syndromes based on the plurality of frames; determining, by the input processing module, a plurality of Reed-Solomon (RS) syndromes based on the plurality of sets of delta syndromes; and storing, by the input processing module, the plurality of BCH syndromes and the plurality of RS syndromes in a buffer; obtaining, by a decoder module implemented by the at least one processor, the plurality of BCH syndromes and the plurality of RS syndromes from the buffer; performing, by the decoder module, BCH decoding on the plurality of frames based on the plurality of BCH syndromes; and performing, by the decoder module, RS decoding on the plurality of frames based on the plurality of RS syndromes and a result of the BCH decoding; and obtaining, by an output processing module implemented by the at least one processor, decoded information bits corresponding to the GCC codeword based on a result of the RS decoding and the result of the BCH decoding.

According to embodiments, a method for decoding a generalized concatenated code (GCC) codeword, is executed by at least one processor includes obtaining the GCC codeword from a storage device, wherein the GCC codeword includes a plurality of frames encoded according to an inner coding scheme and arranged as a plurality of rows, and wherein each column of a plurality of columns corresponding to the plurality of rows is encoded according to an outer coding scheme; calculating a plurality of inner syndromes based on the plurality of frames, wherein the plurality of inner syndromes correspond to the inner coding scheme; calculating a plurality of sets of delta syndromes based on the plurality of frames; determining a plurality of outer syndromes based on the plurality of sets of delta syndromes, wherein the plurality of outer syndromes correspond to the outer coding scheme; storing the plurality of inner syndromes and the plurality of outer syndromes in a buffer; performing inner decoding on the plurality of frames according to the inner coding scheme based on the plurality of inner syndromes stored in the buffer; updating at least one outer syndrome of the plurality of outer syndromes stored in the buffer based on a result of the inner decoding; and performing outer decoding on the plurality of frames according to the outer coding scheme based on the updated at least one outer syndrome; and obtaining decoded information bits corresponding to the GCC codeword based on a result of the inner decoding and the result of the outer decoding.

BRIEF DESCRIPTION OF DRAWINGS

FIG. 4 illustrates a illustrates an example of a BCH decoding pipeline of a BCH decoding flow according to embodiments.

DETAILED DESCRIPTION

Figure 1:
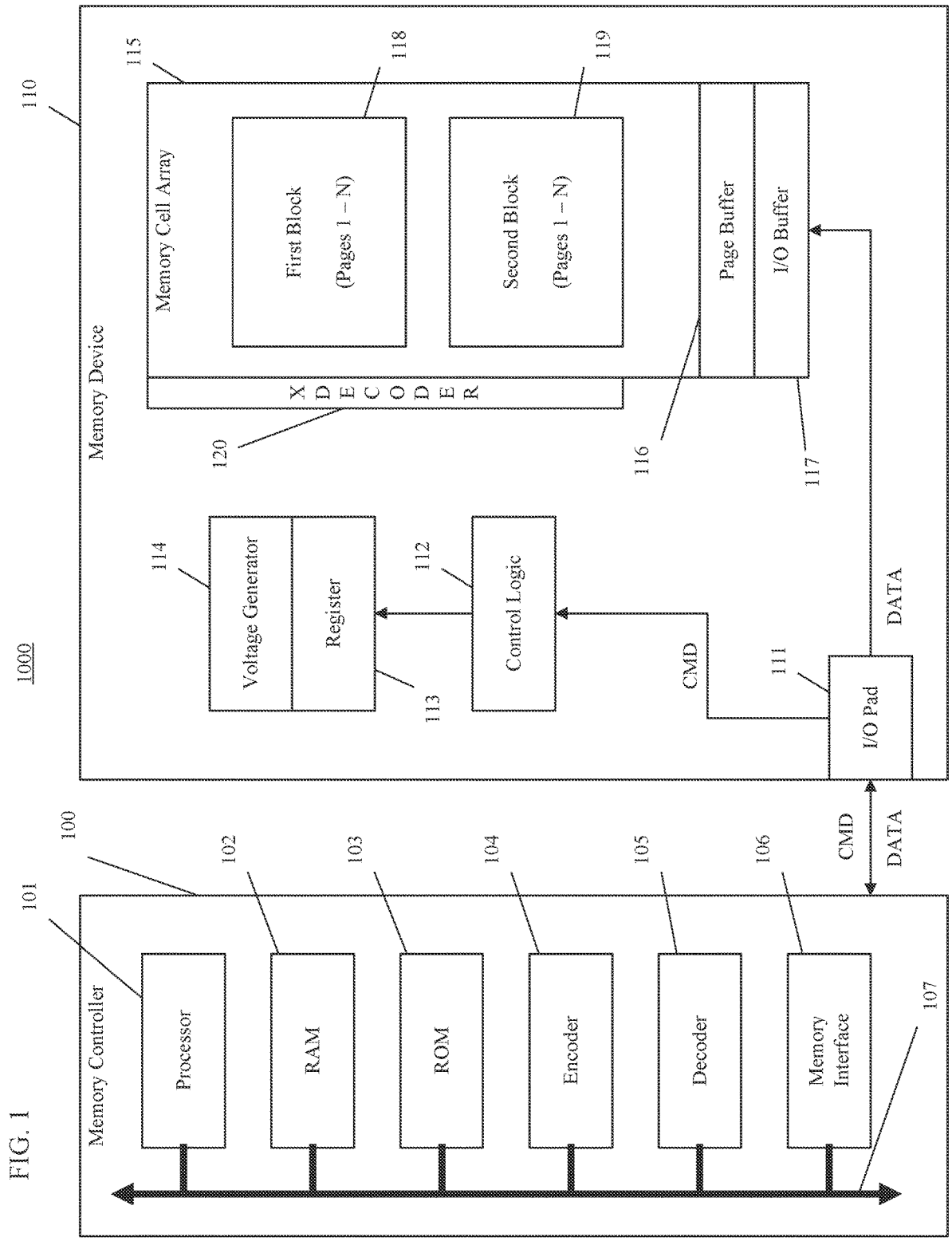
FIG. 1 is a block diagram of a memory system according to embodiments.

FIG. 1 is a block diagram of a memory system 1000 according to embodiments. Referring to FIG. 1, the memory system 1000 may include the memory controller 100 and a memory device 110, which may be a nonvolatile memory device.

The memory device 110 may be, but is not limited to, a flash memory device, a NAND flash memory device, a phase change RAM (PRAM), a ferroelectric RAM (FRAM), a magnetic RAM (MRAM), etc. According to embodiments, the memory device 110 may include a plurality of NAND flash memory devices. The memory device 110 may have a planar structure or a three-dimensional (3D) memory cell structure with a stack of memory cells.

The memory device 110 may include a memory cell array 115, an X Decoder 120, a voltage generator 114, an input/output (I/O) buffer 117, a page buffer 116, and a control logic 112 each of which may be implemented as one or more circuits. The memory device 110 may also include an I/O pad 111.

The memory cell array 115 may include a plurality of word lines and a plurality of bit lines. Each memory cell of the memory cell array 115 may be implemented as a nonvolatile memory cell. For example, each memory cell of the memory cell array 115 may have, for example, a floating gate or a charge storage layer such as a charge trapping layer.

The memory cell array 115 may include a plurality of blocks and a plurality of pages. Each block may include a plurality of pages. For example, a first block 118 may include a first plurality of pages 1-N while a second block 119 may include a second plurality of pages 1-N, where N is an integer greater than 1. A page may be a unit of program and read operations, and a block may be a unit of erase operation.

The control logic 112 may control the overall operation of the memory device 110. When receiving a command CMD from the memory controller 100, the control logic 112 may interpret the command CMD and control the memory device 110 to perform an operation (e.g., a program operation, a read operation, a read retry operation, or an erase operation) according to the interpreted command CMD.

The X Decoder 120 may be controlled by the control logic 112 and drive at least one of the word lines in the memory cell array 115 according to a row address.

The voltage generator 114 may be controlled by the control logic 112 to generate one or more voltages required for a program operation, a read operation or an erase operation and provide the generated voltages to one or more rows selected by the X Decoder 120.

The page buffer 116 may be controlled by the control logic 112 and operate as a sense amplifier or a write driver according to an operation mode (e.g., a read operation or a program operation).

The I/O pad 111 and the I/O buffer 117 may serve as I/O paths of data exchanged between an external device, e.g., the memory controller 100 or a host and the memory device 110.

The memory controller 100 may include a processor 101, a read-only memory (ROM) 103, a random access memory (RAM) 102, an encoder 104, a decoder 105, a memory interface 106, and a bus 107. The elements 101 through 106 of the memory controller 100 may be electrically connected to each other through the bus 107.

The processor 101 may control the overall operation of the memory system 1000 including the memory controller 100. The processor 101 may include a circuit that controls other elements by generating control signals. When power is supplied to the memory system 1000, the processor 101 may drive firmware (e.g., stored in the ROM 103) for operating the memory system 1000 on the RAM 102, thereby controlling the overall operation of the memory system 1000. According to embodiments, the processor 101 may also issue instructions for controlling operations of other elements of the memory controller 100 including, for example, some or all of the ROM 103, RAM 102, encoder 104, decoder 105, memory interface 106, and a bus 107. According to embodiments, any operations described herein as being performed by the memory controller 100 may be performed by, or under the control of, the processor 101. According to embodiments, any operations described herein as being performed by the memory controller 100 may be performed by, or under the control of, the processor 101 executing instructions that correspond to the operations and are included in program code (e.g., stored in the ROM 103).

A driving firmware code of the memory system 1000 may be stored in the ROM 103, however embodiments are not limited thereto. The firmware code can also be stored in a portion of the memory device 110. Therefore, the control or intervention of the processor 101 may encompass not only the direct control of the processor 101 but also the intervention of firmware which is software driven by the processor 101.

The RAM 102, which may include a memory serving as a buffer, may store an initial command, data, and various variables input from a host or the processor 101, or data output from the memory device 110. The RAM 102 may store data and various parameters and variables input to and output from the memory device 110.

The memory interface 106 may serve as an interface between the memory controller 100 and the memory device 110. The memory interface 106 is connected to the I/O pad 111 of the memory device 110 and may exchange data with the I/O pad 111. In addition, the memory interface 106 may create a command suitable for the memory device 110 and provide the created command to the I/O pad 111 of the memory device 110. The memory interface 106 provides a command to be executed by the memory device 110 and an address ADD of the memory device 110.

According to embodiments, the decoder 105 may be an error correcting code (ECC) decoder configured to decode data in the manner described above, and the encoder 104 may be an ECC encoder configured to encode data in the manner described above. According to embodiments, the decoder 105 and the encoder 104 may perform error bit correction in the manner described above. The encoder 104 may generate data added with one or more parity and/or redundancy bits by performing error correction encoding on data before the data is provided to the memory device 110. The one or more parity and/or redundancy bits may be stored in the memory device 110.

The decoder 105 may perform error correction decoding on output data, determine whether the error correction decoding is successful based on the result of the error correction decoding, and output an instruction signal based on the determination result. Read data may be transmitted to the decoder 105, and the decoder 105 may correct error bits of the data using the one or more parity and/or redundancy bits.

FIG. 1 is a block diagram of a memory system 1000 according to embodiments of the present disclosure. Referring to FIG. 1, the memory system 1000 may include the memory controller 100 and a memory device 110, which may be a nonvolatile memory device.

The memory device 110 may be, but is not limited to, a flash memory device, a NAND flash memory device, a phase change RAM (PRAM), a ferroelectric RAM (FRAM), a magnetic RAM (MRAM), etc. According to embodiments, the memory device 110 may include a plurality of NAND flash memory devices. The memory device 110 may have a planar structure or a three-dimensional (3D) memory cell structure with a stack of memory cells.

The memory device 110 may include a memory cell array 115, an X Decoder 120, a voltage generator 114, an input/output (I/O) buffer 117, a page buffer 116, and a control logic 112 each of which may be implemented as one or more circuits. The memory device 110 may also include an I/O pad 111.

The memory cell array 115 may include a plurality of word lines and a plurality of bit lines. Each memory cell of the memory cell array 115 may be implemented as a nonvolatile memory cell. For example, each memory cell of the memory cell array 115 may have, for example, a floating gate or a charge storage layer such as a charge trapping layer.

The memory cell array 115 may include a plurality of blocks and a plurality of pages. Each block may include a plurality of pages. For example, a first block 118 may include a first plurality of pages 1-N while a second block 119 may include a second plurality of pages 1-N, where N is an integer greater than 1. A page may be a unit of program and read operations, and a block may be a unit of erase operation.

The control logic 112 may control the overall operation of the memory device 110. When receiving a command CMD from the memory controller 100, the control logic 112 may interpret the command CMD and control the memory device 110 to perform an operation (e.g., a program operation, a read operation, a read retry operation, or an erase operation) according to the interpreted command CMD.

The X Decoder 120 may be controlled by the control logic 112 and drive at least one of the word lines in the memory cell array 115 according to a row address.

The voltage generator 114 may be controlled by the control logic 112 to generate one or more voltages required for a program operation, a read operation or an erase operation and provide the generated voltages to one or more rows selected by the X Decoder 120.

The page buffer 116 may be controlled by the control logic 112 and operate as a sense amplifier or a write driver according to an operation mode (e.g., a read operation or a program operation).

The I/O pad 111 and the I/O buffer 117 may serve as I/O paths of data exchanged between an external device, e.g., the memory controller 100 or a host and the memory device 110.

The memory controller 100 may include a processor 101, a read-only memory (ROM) 103, a random access memory (RAM) 102, an encoder 104, a decoder 105, a memory interface 106, and a bus 107. The elements 101 through 106 of the memory controller 100 may be electrically connected to each other through the bus 107.

The processor 101 may control the overall operation of the memory system 1000 including the memory controller 100. The processor 101 may include a circuit that controls other elements by generating control signals. When power is supplied to the memory system 1000, the processor 101 may drive firmware (e.g., stored in the ROM 103) for operating the memory system 1000 on the RAM 102, thereby controlling the overall operation of the memory system 1000. According to embodiments, the processor 101 may also issue instructions for controlling operations of other elements of the memory controller 100 including, for example, some or all of the ROM 103, RAM 102, encoder 104, decoder 105, memory interface 106, and a bus 107. According to embodiments, any operations described herein as being performed by the memory controller 100 may be performed by, or under the control of, the processor 101. According to embodiments, any operations described herein as being performed by the memory controller 100 may be performed by, or under the control of, the processor 101 executing instructions that correspond to the operations and are included in program code (e.g., stored in the ROM 103).

A driving firmware code of the memory system 1000 may be stored in the ROM 103, however embodiments are not limited thereto. The firmware code can also be stored in a portion of the memory device 110. Therefore, the control or intervention of the processor 101 may encompass not only the direct control of the processor 101 but also the intervention of firmware which is software driven by the processor 101.

The RAM 102, which may include a memory serving as a buffer, may store an initial command, data, and various variables input from a host or the processor 101, or data output from the memory device 110. The RAM 102 may store data and various parameters and variables input to and output from the memory device 110.

The memory interface 106 may serve as an interface between the memory controller 100 and the memory device 110. The memory interface 106 is connected to the I/O pad 111 of the memory device 110 and may exchange data with the I/O pad 111. In addition, the memory interface 106 may create a command suitable for the memory device 110 and provide the created command to the I/O pad 111 of the memory device 110. The memory interface 106 provides a command to be executed by the memory device 110 and an address ADD of the memory device 110.

According to embodiments, the decoder 105 may be an error correcting code (ECC) decoder configured to decode data in the manner described above, and the encoder 104 may be an ECC encoder configured to encode data in the manner described above. According to embodiments, the decoder 105 and the encoder 104 may perform error bit correction in the manner described above. The encoder 104 may generate data added with one or more parity and/or redundancy bits by performing error correction encoding on data before the data is provided to the memory device 110. The one or more parity and/or redundancy bits may be stored in the memory device 110.

The decoder 105 may perform error correction decoding on output data, determine whether the error correction decoding is successful based on the result of the error correction decoding, and output an instruction signal based on the determination result. Read data may be transmitted to the decoder 105, and the decoder 105 may correct error bits of the data using the one or more parity and/or redundancy bits. When the number of error bits exceeds a limit of error bits that can be corrected, the decoder 105 may decode according to a higher level of data organization, examples of which are described below.

In embodiments, the encoder 104 and the decoder 105 may perform error correction using a generalized concatenated code (GCC), examples of which are described below.

Embodiments may relate to a coding scheme that extends a correction capability of a coding scheme, for example a Bose-Chaudhuri-Hocquenghem (BCH) coding scheme, from to errors to $t_i = t_0 + \Delta t_i$ errors, where 'i' is a stage index, to is an initial error correction capability of the reliability bits of a data frame of the coding scheme, and $\Delta t_i$ is the change in correction capability relative to $t_0$.

For example, in a BCH coding scheme, a word (i.e., series of data bits) received at a decoder (e.g., decoder 105) may be represented as $y = c + e$, where c is a code word, e is an errors sequence, $c \in C$, $n = 2^m - 1$, C is a basic BCH code with a correction capability of $t_0$ errors, n is a code length of the code word c, and m is a positive integer.

The decoder can decode the code word based on the syndrome of the error sequence $S_e^{t_0}$ as is described below. Because, $S_y^{t_0} = H^{t_0} \cdot y = H^{t_0} \cdot (c+e) = H^{t_0} \cdot e$, $S_e^{t_0}$ can be computed as $H^{t_0} \cdot y$ in accordance with Equation (1):

$$S_e^{t_0} = H^{t_0} \cdot e = H^{t_0} \cdot y = \begin{pmatrix} 1 & \alpha & \cdots & \alpha^{n-1} \\ \vdots & \alpha^3 & \ddots & \vdots \\ 1 & \alpha^{2t_0-1} & \cdots & \alpha^{(2t_0-1)(n-1)} \end{pmatrix} \cdot y \quad \text{(Equation 1)}$$

In order to extend the error correction capability to $t_i = t_0 + \Delta t_i$, the decoder should have the extended error syndrome expressed by Equation (2) below:

$$S_e^{t_i} = H^{t_i} \cdot e = \quad \text{(Equation 2)}$$

$$\begin{pmatrix} 1 & \alpha & \cdots & \alpha^{n-1} \\ \vdots & \alpha^3 & \cdots & \vdots \\ 1 & \alpha^{2t_0-1} & \cdots & \alpha^{(2t_0-1)(n-1)} \\ 1 & \alpha^{2t_0+1} & \cdots & \alpha^{(2t_0+1)(n-1)} \\ \vdots & \alpha^{2t_0+3} & \cdots & \vdots \\ 1 & \alpha^{2t_i-1} & \cdots & \alpha^{(2t_i-1)(n-1)} \end{pmatrix} \cdot e = \begin{pmatrix} H^{t_0} \\ H^{\Delta t_i} \end{pmatrix} \cdot e = \begin{pmatrix} H^{t_0} \cdot e \\ H^{\Delta t_i} \cdot e \end{pmatrix}$$

The decoder can compute $S_y^{t_i}$ according to Equation (3) below:

$$S_y^{t_i} = H^{t_i} \cdot y = H^{t_i} \cdot (c+e) = \begin{pmatrix} H^{t_0} \cdot (c+e) \\ \Delta H^{t_i} \cdot (c+e) \end{pmatrix} = \begin{pmatrix} H^{t_0} \cdot e \\ \Delta H^{t_i} \cdot (c+e) \end{pmatrix} \quad \text{(Equation 3)}$$

Accordingly, if the decoder has side information $\Delta H^{t_i} \cdot c = S_c^{\Delta t_i}$, the decoder can evaluate the extended error syndrome defined by Equation (4) below:

$$S_e^{t_i} = \begin{pmatrix} S_e^{t_0} \\ S_y^{\Delta t_i} - S_c^{\Delta t_i} \end{pmatrix} = \begin{pmatrix} S_e^{t_0} \\ S_e^{\Delta t_i} \end{pmatrix} \quad \text{(Equation 4)}$$

This side information may be referred to as a delta syndrome of the code word c, $S_c^{\Delta t_i}$, and may be represented according to Equation (5) below:

$$S_c^{\Delta t_i} = \quad \text{(Equation 5)}$$

$$\begin{pmatrix} 1 & \alpha^{2t_0+1} & \cdots & \alpha^{(2t_0+1)(n-1)} \\ \vdots & \alpha^{2t_0+3} & \cdots & \vdots \\ 1 & \alpha^{2t_i-1} & \cdots & \alpha^{(2t_i-1)(n-1)} \end{pmatrix} \cdot c = \begin{pmatrix} c(\alpha^{2t_0+1}) \\ \vdots \\ c(\alpha^{2t_i+1}) \end{pmatrix} = \begin{pmatrix} \alpha^{j_1} \\ \vdots \\ \alpha^{j_{\Delta t_i}} \end{pmatrix}$$

where $0 \leq j < 2^m - 2$.

Embodiments may be applied to a variation of BCH known as Super Bose-Chaudhuri-Hocquenghem (SBCH). SBCH is a multilevel algebraic code including several short binary Bose-Chaudhuri-Hocquenghem (BCH) codes and non-binary Reed-Solomon (RS) codes. As opposed to the message-passing decoding algorithm of low density parity check (LDPC) codes, which requires iteratively interchanging large amounts of soft information between variable and check nodes, the decoding algorithm for SBCH codes is entirely algebraic, using standard algebraic decoding modes for the short component BCH and RS codes. For this reason, the power consumption of an SBCH decoder may be considerably smaller than that of a corresponding LDPC decoder.

According to embodiments, an SBCH codeword may be represented as a matrix in which each row is a BCH codeword of length n, and at least one column is an RS codeword having a length equal to the number of rows. For example, for a given row represented by a BCH codeword c, the delta syndromes $S_c^{\Delta t_i}$ may include at least one RS syndrome of an RS codeword.

Figure 2:
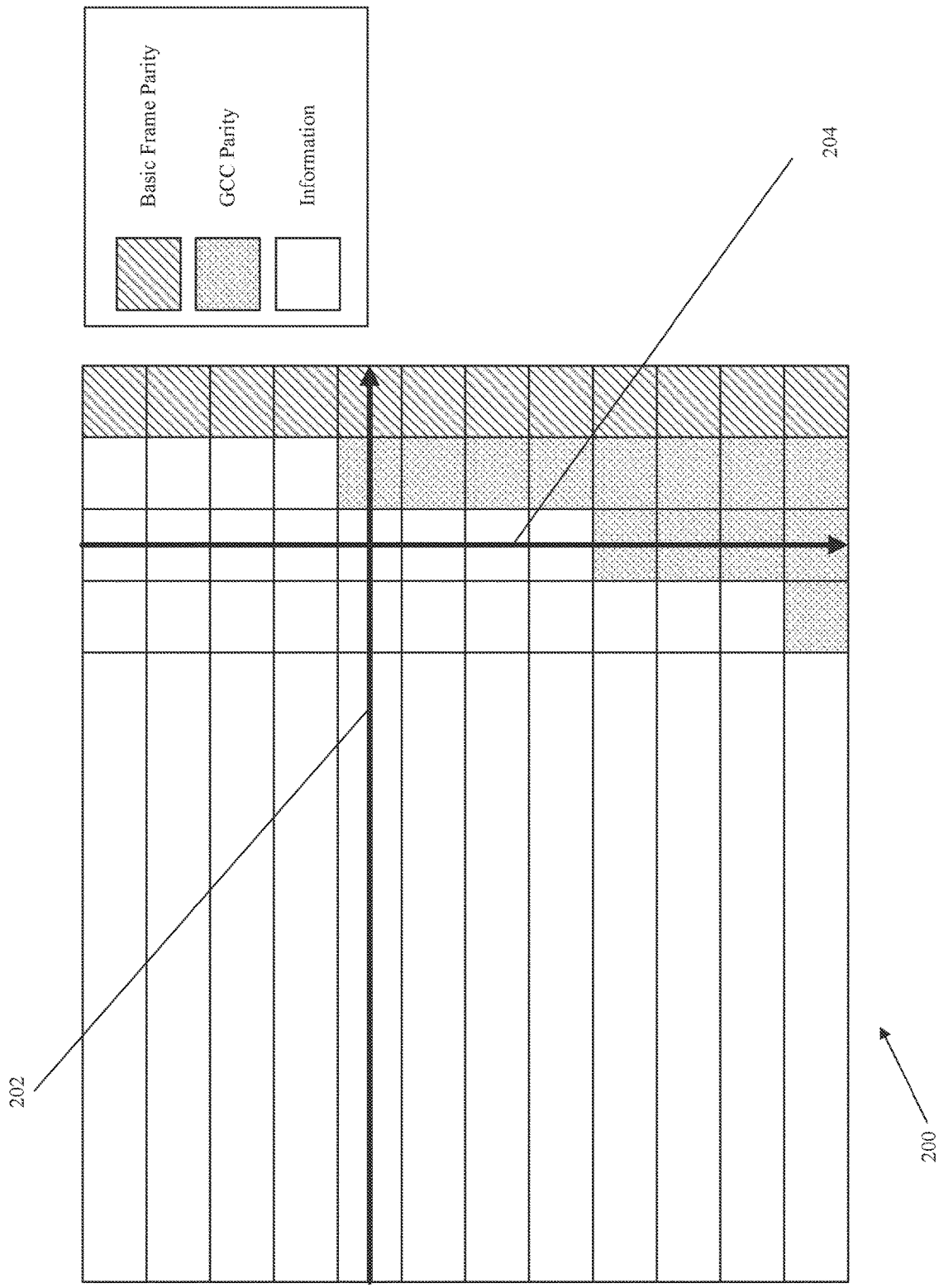
FIG. 2 is a diagram of an example GCC codeword according to embodiments.

FIG. 2 is a diagram of an example GCC codeword according to embodiments. A GCC decoder, which may correspond for example to decoder 105, may receive frames, decoded with a frame decoder. In a linear GCC coding scheme, for example the SBCH coding scheme discussed above, the frame code is a linear code. For example, in the SBCH coding scheme discussed above, the frame code may be the BCH code discussed above, which may be linear.

In embodiments, the frames of a GCC code may include a variable amount of parity bits. For example, as illustrated for FIG. 2, a frame 202 may include basic parity bits and GCC parity bits. As an example, the frame may correspond to a codeword c, the basic parity bits may be parity bits for a BCH coding scheme, and may be used to calculate the basic syndromes $S_c^{t_0}$, and the GCC parity bits may be parity bits for an RS coding scheme, and may be used to calculate the delta syndromes $S_c^{\Delta t_i}$. A decoding ability of the GCC decoder may be correlated with the amount of parity bits available.

Following decoding the frames with the basic parity (e.g., stage 0, with for example a correction capability of to bits), some frames may succeed and some may fail. In embodiments, additional parity can be obtained by decoding an RS codeword, and in the next stage (e.g., stage 1), frames can be decoded with additional information, which may allow more frames to be corrected. Accordingly, at a next stage (e.g., stage 2), another RS codeword can be decoded, and so on until all frames are corrected.

Figure 3:
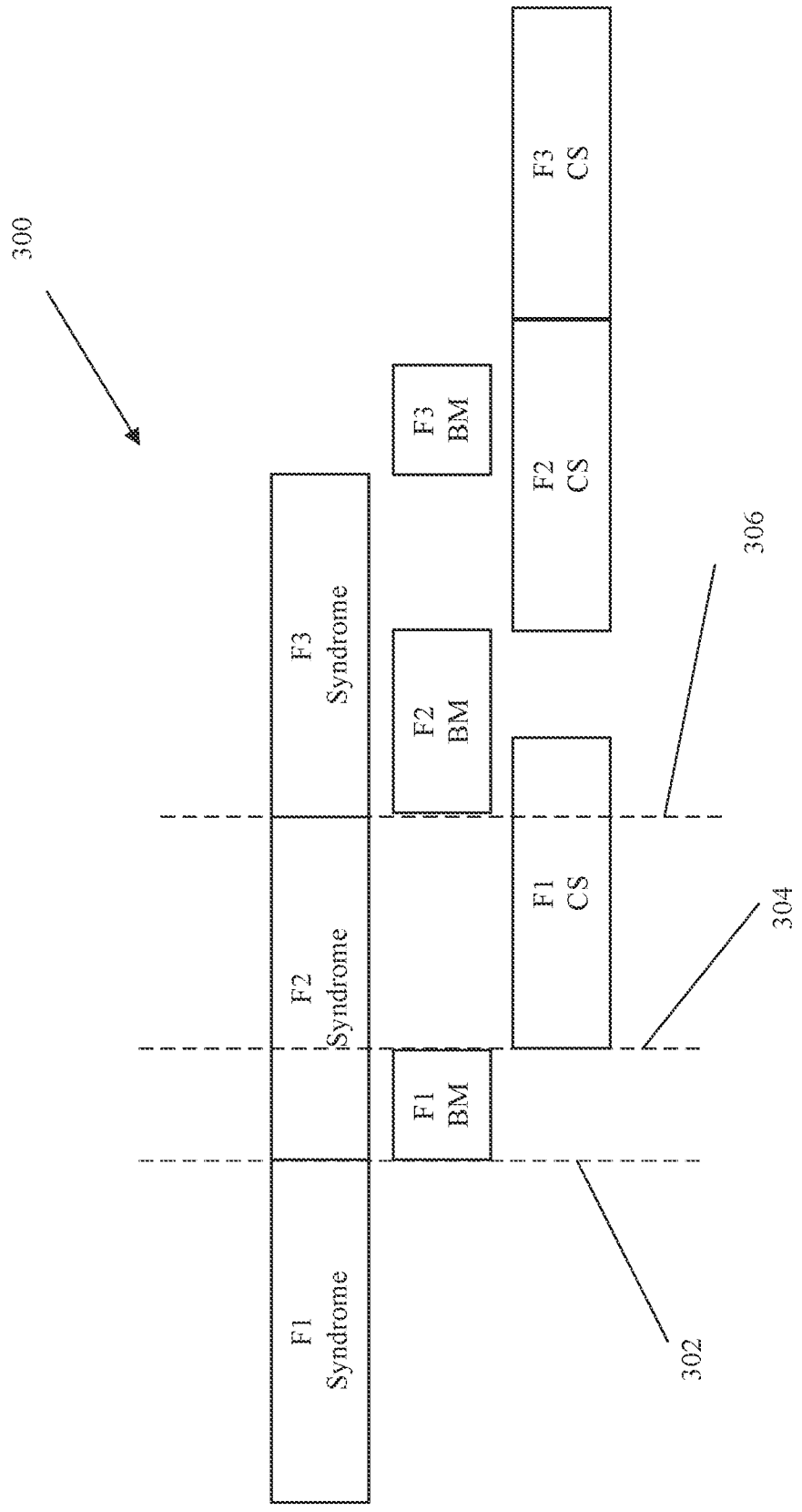
FIG. 3 illustrates an example of a BCH decoding pipeline of a related art BCH decoding flow, according to embodiments.

FIG. 3 illustrates an example of a BCH decoding pipeline 300 of a related art BCH decoding flow. As shown in FIG. 3, a first frame F1 is read, and the basic syndromes are calculated. In embodiments, the basic syndromes may be referred to as, for example, BCH syndromes, to syndromes, row syndromes, or channel row syndromes. Then, at time 302, a Berlekamp-Massey (BM) algorithm is used to find an error locator polynomial (ELP) corresponding to the first frame F1, and at time 304, a Chien search (CS) algorithm is used to find flipped bits in the first frame F1, and the first frame F1 is corrected. Then, the delta syndromes are calculated on the corrected first frame F1, and stored for example in a table. The same procedure is subsequently performed on second frame F2 and third frame F3.

A corresponding RS decode flow for an RS codeword includes reading a column of the delta syndromes from the table to calculate an RS syndrome (RSS), and calculating an initial error locator polynomial (ELP) based on failing BCH frames. Then an error estimator polynomial is calculated, and error detection is performed. If errors are detected, then a BM, CS, ELP, and EEP update is performed, and a Forney algorithm is used to correct delta syndromes corresponding to the detected errors. During the decoding process, the table with all delta-syndromes of all frames may be maintained, or may be re-calculated for all frames, for example at each stage.

As can be seen in FIG. 3, the basic syndromes for the second frame F2 cannot be calculated until after time 302, and the BM algorithm cannot be performed for the second frame F2 until time 306, after the basic syndromes for the second frame F2 are calculated. As a result, bottlenecking may occur in the BCH decoding pipeline 300. In addition, a size of a memory space used to save the table of syndromes, for example in a buffer associated with the decoder, may be large.

FIG. 4 illustrates a illustrates an example of a BCH decoding pipeline 400 of a BCH decoding flow according to embodiments. In embodiments, an input phase is performed before the start of the BCH decoding pipeline 400. During the input phase, all basic syndromes and all delta syndromes for each frame are calculated. Then, for each delta syndrome, a contribution of the delta syndrome to the RSS for each RS codeword is determined and accumulated. Then the basic syndromes and the RSS is stored, for example in a buffer. As a result, at a time 402 at the beginning of the BCH decoding pipeline 400, the basic syndromes are already calculated. For example, the basic syndromes and initial delta syndromes are calculated in the input phase, and higher syndromes may be received from RS decoding after it is performed.

Therefore, at time 402, a BM algorithm may be used to find the ELP corresponding to the first frame F1, and at time 404 a CS algorithm may be used to find roots of the ELP in order to locate flipped bits in the first frame F1. In addition, at time 404 the BM algorithm may be applied to the second frame F2, with no need for additional time to calculate the basic syndromes for the second frame F2. Then, at time 406 the CS algorithm may be used to find roots of the ELP for the second frame F2 in order to locate flipped bits in the second frame F2, and so on. If flipped bits are detected, then higher syndromes, for example delta syndromes, are calculated based on the flipped bits only, and then the corresponding RSS is updated. Accordingly, in embodiments a delta syndrome calculation does not follow the CS algorithm, and the CS algorithm calculation can be optimized.

In a corresponding RS decode flow for an RS codeword, the RSS is ready at the beginning of the RS decode flow, and the ELP is maintained through the decode process. Accordingly, the RS decode flow may begin with EEP calculation and error detection, and then if errors are detected, a BM, CS, ELP, and EEP update is performed, and a Forney algorithm is used to correct delta syndromes corresponding to the detected errors. Correction values for the corrected delta syndromes may be used as the delta syndromes for the next level, for example the next decoding stage.

As a result, the GCC decoding flow according to embodiments corresponding to FIG. 4 may not include the syndrome calculation phase discussed above with respect to FIG. 3. This may increase throughput of the decoding flow. In addition, in frames having a low number of errors, the CS phase can be optimized as well. Further, because a smaller syndrome buffer may be used, for example only storing delta syndromes for frames having errors, a gate-count of the syndrome buffer may be reduced. As a result, a size of a memory space used for the decoding may be reduced.

Figure 5A:
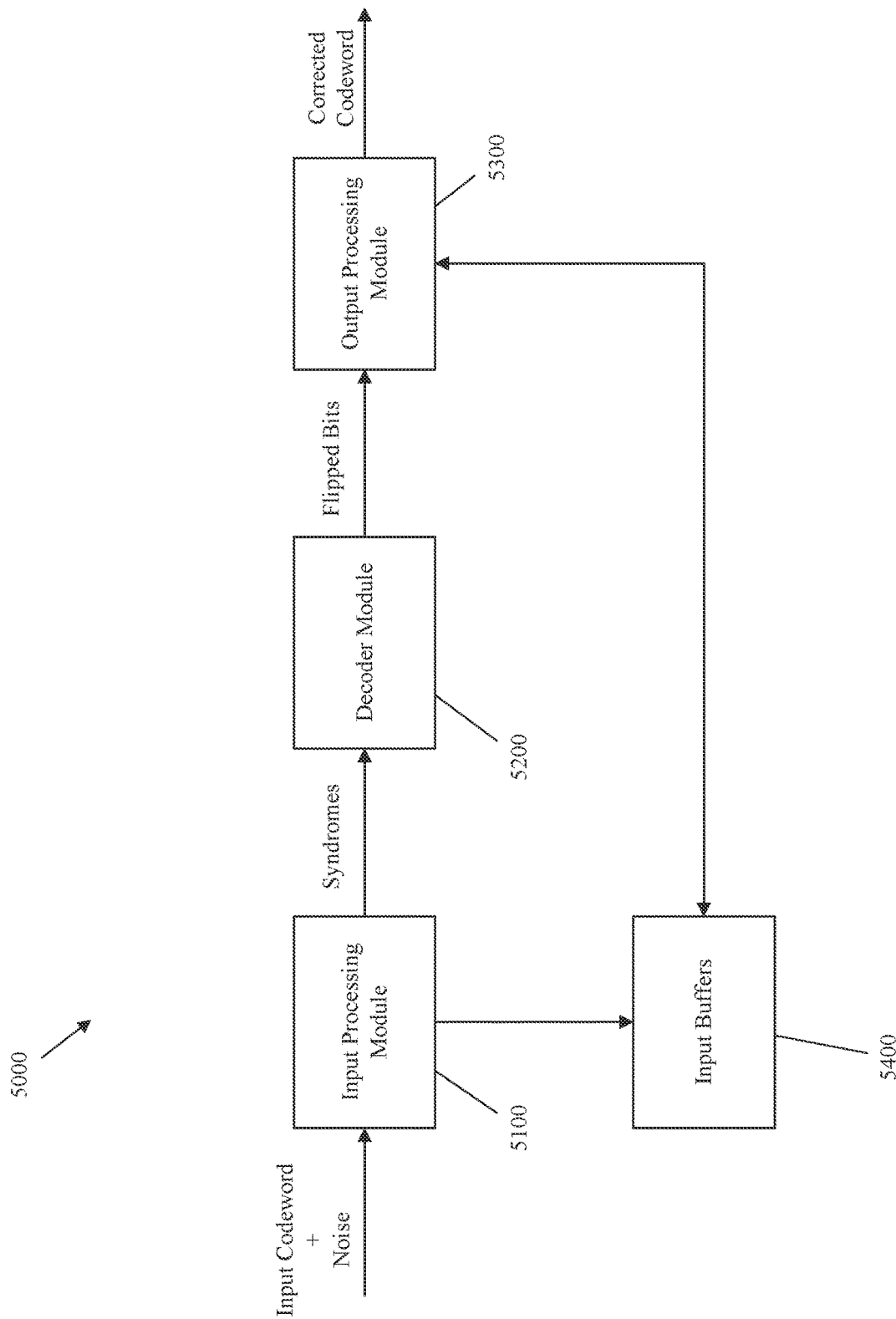
FIG. 5A is a block diagram of a decoder, according to embodiments.

FIGS. 5A-5E are block diagrams of a decoder 5000 and elements included therein, according to embodiments. FIG. 5A is a block diagram of a decoder 5000, according to embodiments. In embodiments, the decoder 5000 may include an input processing module 5100, a decoder module 5200, which may be for example a decoder core, an output processing module 5300, and input buffers 5400. In embodiments, the decoder 5000 may correspond to any of the decoders discussed above, for example the decoder 105. In embodiments, the decoder 5000 may perform three pipelined phases, for example in order to support throughput requirements.

The first phase may be, for example, an input phase, and may correspond to the input processing module 5100. During the input phase, a received codeword, which may include for example the codeword and noise corresponding to the reception of the codeword, may be stored in a buffer, for example a buffer included in input buffer 5400. In addition, initial calculations, for example the syndrome calculations discussed above, may be performed on the input, and a result of the calculations, for example the syndromes, may be provided to the decoder module 5200.

The second phase may be, for example, a decode phase, and may correspond to the decoder module 5200. During the decode phase, the syndromes calculated in the input phase may be provided to the decoder module 5200, and the decoder module 5200 may determine errors such as flipped bits in the input codeword, and may provide information corresponding to these errors, for example indexes of the flipped bits, to the output processing module 5300.

The third phase may be, for example, a post-decode phase, and may correspond to the output processing module 5300. During the post-decode phase, the output processing module may generate a decoded codeword, which may be for example a corrected codeword corresponding to the input codeword, by flipping bits in the input codeword based on a result of the decode phase, and may output the corrected codeword.

Figure 5B:
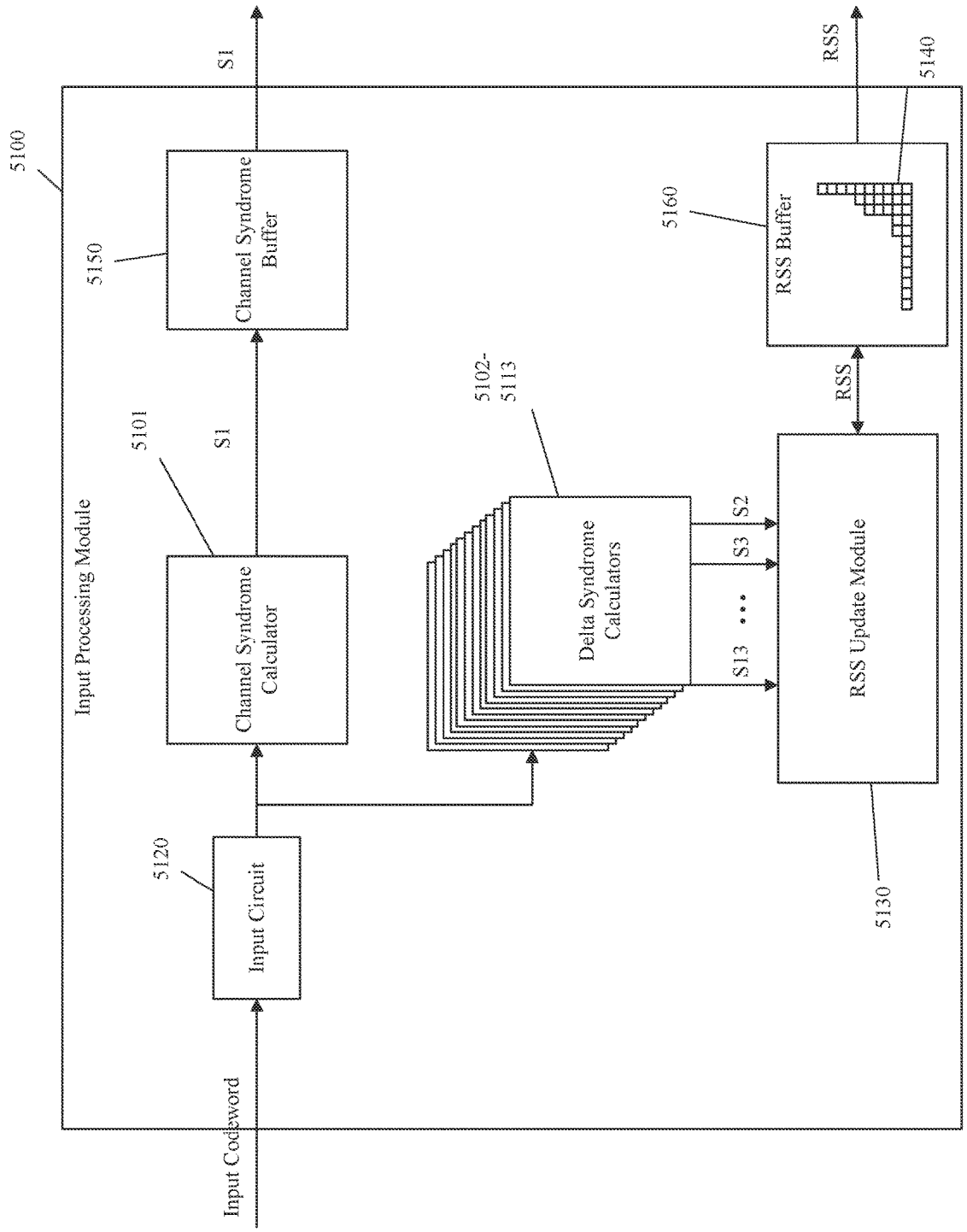
FIG. 5B is a block diagram of an example of an input module, according to embodiments.

FIG. 5B is a block diagram of an example of the input processing module 5100, according to embodiments. In embodiments, the input processing module 5100 may include an input circuit 512, a channel syndrome calculator 5101, delta syndrome calculators 5102-5113, a channel syndrome buffer 5150, an RS S update module 5130 and an RS S buffer 5160. Although the channel syndrome buffer 5150 and the RS S buffer 5160 are illustrated as separate elements in FIG. 5B, embodiments are not limited thereto. For example, in embodiments the channel syndrome buffer 5150 and the RSS buffer 5160 may be combined as one element, or may be included in other elements, for example the input buffers 5400. FIG. 5B illustrates an example in which to of the BCH coding is 1, and there are 12 additional syndromes, however embodiments are not limited thereto.

During the input phase, the input codeword may be received by the input circuit 5120. In embodiments, the input circuit 5120 may include input emulation logic and may interface with other elements for providing the input codeword. The input codeword may then be processed by channel syndrome calculator 5101 to determine the channel syndrome S1, and delta syndrome calculators 5102-5113 to determine the additional syndromes S2-S13. In embodiments, the channel syndrome S1 may be referred to for example as the row syndrome or the channel row syndrome, and may correspond to the basic syndrome of the current row or frame. In embodiments, the additional syndromes S12-S13 may correspond to delta syndromes for the current row or frame. In embodiments, the syndrome calculations may be done using Homer rule HW, for 16 bits per cycle, according to input rate.

In embodiments, the channel syndrome S1 may be stored in the channel syndrome buffer 5150, which may be referred for example as a row syndrome buffer or a channel row syndrome buffer. In embodiments, the channel syndrome buffer 5150 may be allocated in the input buffer 5400.

In embodiments, the additional syndromes S2-S13 may be provided to the RSS update module 5130 to update RS syndromes, which may be stored for example in RSS buffer 5160. FIG. 5B illustrates an example RSS 5140, which includes 12 columns corresponding to additional syndromes S12-S13, however embodiments are not limited thereto. In embodiments, the additional syndromes S2-S13 may be used only to update and maintain RSS, and may be not used later in the decoding phase. Accordingly, the additional syndromes S2-S13 may not be stored in a buffer such as channel syndrome buffer 5150 or RSS buffer 5160. In embodiments, when D−1=1, the RSS update calculation may be, for example, a simple XOR operation.

In embodiments, the basic syndrome of the frame, for example channel syndrome S1, and the RSS, for example RSS 5140, may be passed to the decoder module 5200. In embodiments, for example parity bits corresponding to any of the parity bits discussed above, such as the basic parity bits and GCC parity bits, may also be provided to the decoder module 5200. In embodiments, any of the input codeword, the syndromes S1-S13, the RSS 5140, the parity bits, or any other information, may also be provided to input buffers 5400.

There may be several benefits to calculating all channel syndromes, including for example the channel syndrome S1 and the additional syndromes S2-S13, during the input phase. For example, the calculation rate can be set according to input rate, which may allow the use of smaller or lower-complexity hardware. In addition, this may remove or reduce the need to calculate frames mapping in the decoder module 5200. Further, the calculation of all channel syndromes in the input phase may increase throughput efficiency by sparing this latency from the decode phase. Further, in embodiments some or all of the hardware used for these calculations in the input phase may be repurposed for other calculations, for example cyclic redundancy check calculations, in other phases or at other times.

Figure 5C:
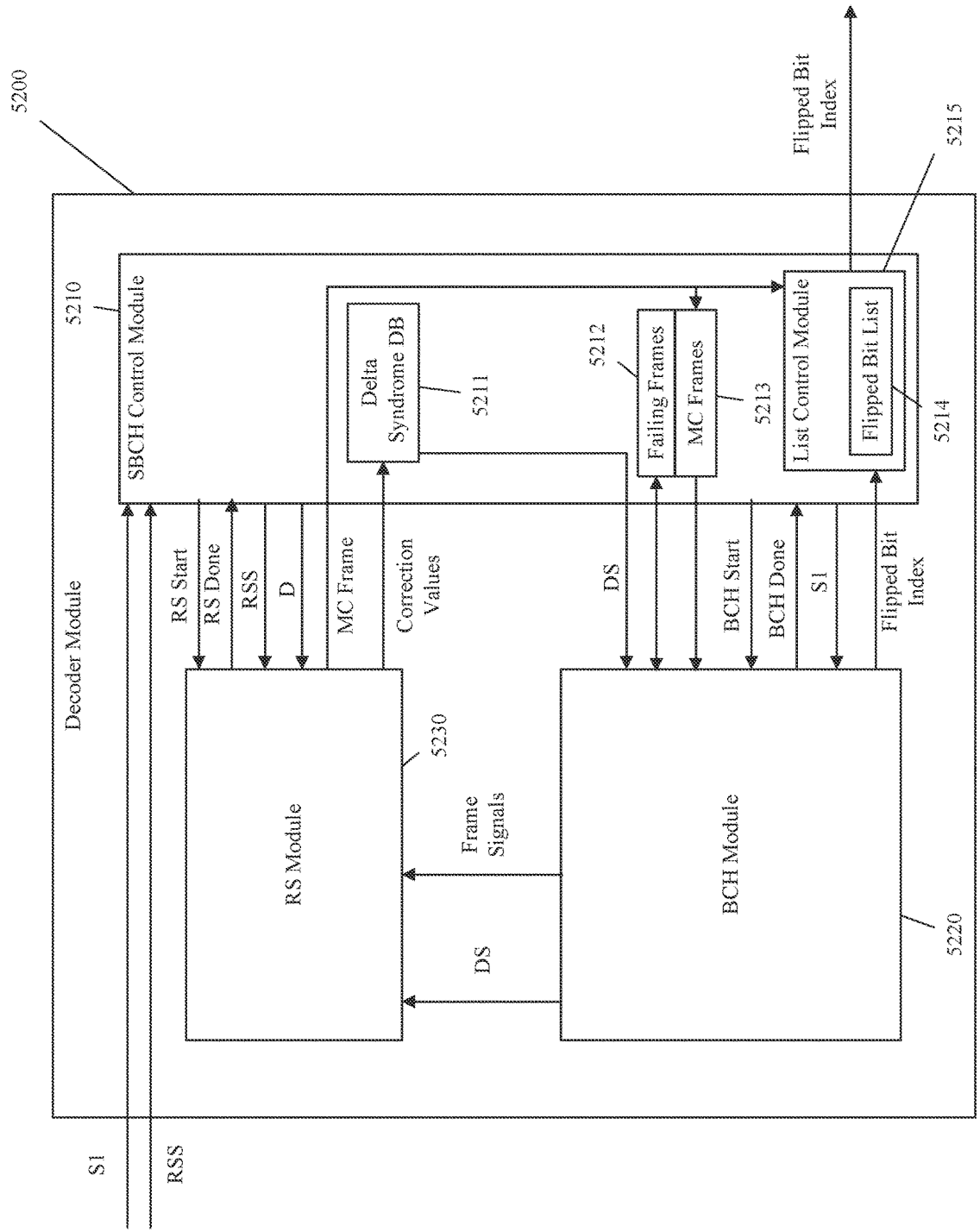
FIG. 5C is a block diagram of an example of a decoder module, according to embodiments.

FIG. 5C is a block diagram of an example of the decoder module 5200, according to embodiments. In embodiments, the decoder module 5200 may include an SBCH control module 5210, a BCH module 5220, and an RS module 5230.

In embodiments, the SBCH control module 5210 may be responsible for maintaining common variables and conducting an SBCH flow, for example by managing various signals in order to activate and manage BCH module 5220 and RS module 5230. For example, the SBCH control module 5210 may provide a BCH start signal which may activate the BCH module 5220 when appropriate, and may provide information such as a failing frames signal, a miscorrected (MC) frames signal, the channel row syndrome S1, and updated delta syndromes DS to the BCH module 5220 to manage the operation of the BCH module 5220. In addition, the SBCH control module 5210 may receive a BCH done signal from the BCH module 5220 indicating that a BCH operation is finished, and may receive information such as a flipped bit index or a failing frames signal indicating a result of a BCH operation. The SBCH control module 5210 may include a failing frames module 5212 which may track failing frames, and an MC frames module 5213 which may track MC frames. In addition, the SBCH control module 5210 may include a list control module 5215, which may store for example a flipped bit list 5214 which may be used to track bits that are flipped as a result of the SBCH decoding.

As another example, the SBCH control module may provide an RS start signal which may activate the RS module 5230 when appropriate, and may provide information such as an RSS or a value of D to the RS module 5230 to manage the operation of the RS module 5230. In addition, the SBCH control module 5210 may receive an RS done signal from the RS module 5230 indicating that an RS operation is finished, and may receive information such as an MC frames signal or one or more correction values for correcting values of delta syndromes indicating a result of an RS operation. The SBCH control module 5210 may include a delta syndrome database 5211 which may be used to track the corrected delta syndromes.

The BCH module 5220 may be responsible for scanning the failing frames and activating a BCH decoder with the correct inputs. The RS module 5230, which may be for example a top level block for an RS decoding process, may be responsible for maintaining the RSS and the ELP, and activating an RS decoder as appropriate based on requests from the SBCH control module 5210.

During the decoder phase, the channel row syndrome S1 and the RSS, which may include for example CRC information, may be received by the decoder module 5200. In embodiments, the decoder module 5200 may also receive, for example parity bits, such as the basic parity bits and GCC parity bits discussed above.

As illustrated in FIGS. 5A-5E, $t_0=1$, although embodiments are not limited thereto. In some embodiments, this may mean that in stage 0 decoding all frames may be decoded with a decoder logic, for example Synd2idx logic 5224 discussed in greater detail below. In embodiments, the decoder logic may process the frames at 1 cycle per frame. If an index returned from the decoder logic is within a predetermined range, this may indicate that the decoding of the frame has succeeded. However, embodiments are not limited thereto, and in embodiments the stage 0 decoding may be performed by, for example, the BCH decoder module 5221.

If a bit is flipped during the decoding process, then a flipped bit index indicating an index of the flipped bit may be stored, for example in flipped bit list 5214, and the corresponding RSS columns may be updated, for example including CRC information. In embodiments, stage 0 flips may be written to a static index vector, which may be stored for example in flipped bit list 5214, which may be managed by list control module 5215. If not all frames passed, then RS decoding may be performed by the RS module 5230 on a first stage RSS syndrome RSS1, and corrected delta syndromes may be stored. For example, correction values indicating the corrected delta syndromes may be provided to the delta syndrome database 5211 and stored, for example by being written to a delta syndrome vector in order.

In embodiments, an MC frame may be detected. For example, an error found by RS decoding may mean that a corrected BCH frame is actually incorrect. When an MC frame is detected, the RS module 5230 may invalidate the flip of this frame, for example by providing an MC frame signal to list control module 5215, may calculate the effect of the invalidation on the corresponding delta syndromes and update the delta syndrome database 5211 accordingly, and may cancel the effect of the MC frame on the RSS. In embodiments, this cancellation may include, for example, an XOR operation.

At stage 1 decoding, the BCH decoder module 5221 may be used for up to f1 frames. For each frame up to $t_1$ bits may be flipped. As an example, in embodiments in which $t_0=1$, then $t_1$ may be equal to 2. In embodiments, the first flipped bit may be written to the static index vector, and the second flipped bit may be written to a dynamic allocation. The RSS may then according to delta syndromes calculated on the 2 bits.

If not all frames pass at stage 1 decoding, then RS decoding may be performed by the RS module 5230 on a second stage RSS syndrome RSS2, and corrected delta syndromes may be written to the delta syndrome vector along with the stage 1 corrected delta syndromes. If an MC frame is detected, we invalidate the flip of this frame, calculate its effect on the delta syndromes, and cancel the effect of the MC frame on the RSS.

This process may be repeated with BCH decoding and RS decoding iterations until all the frames are correct, and all RS syndromes equal 0.

Figure 5D:
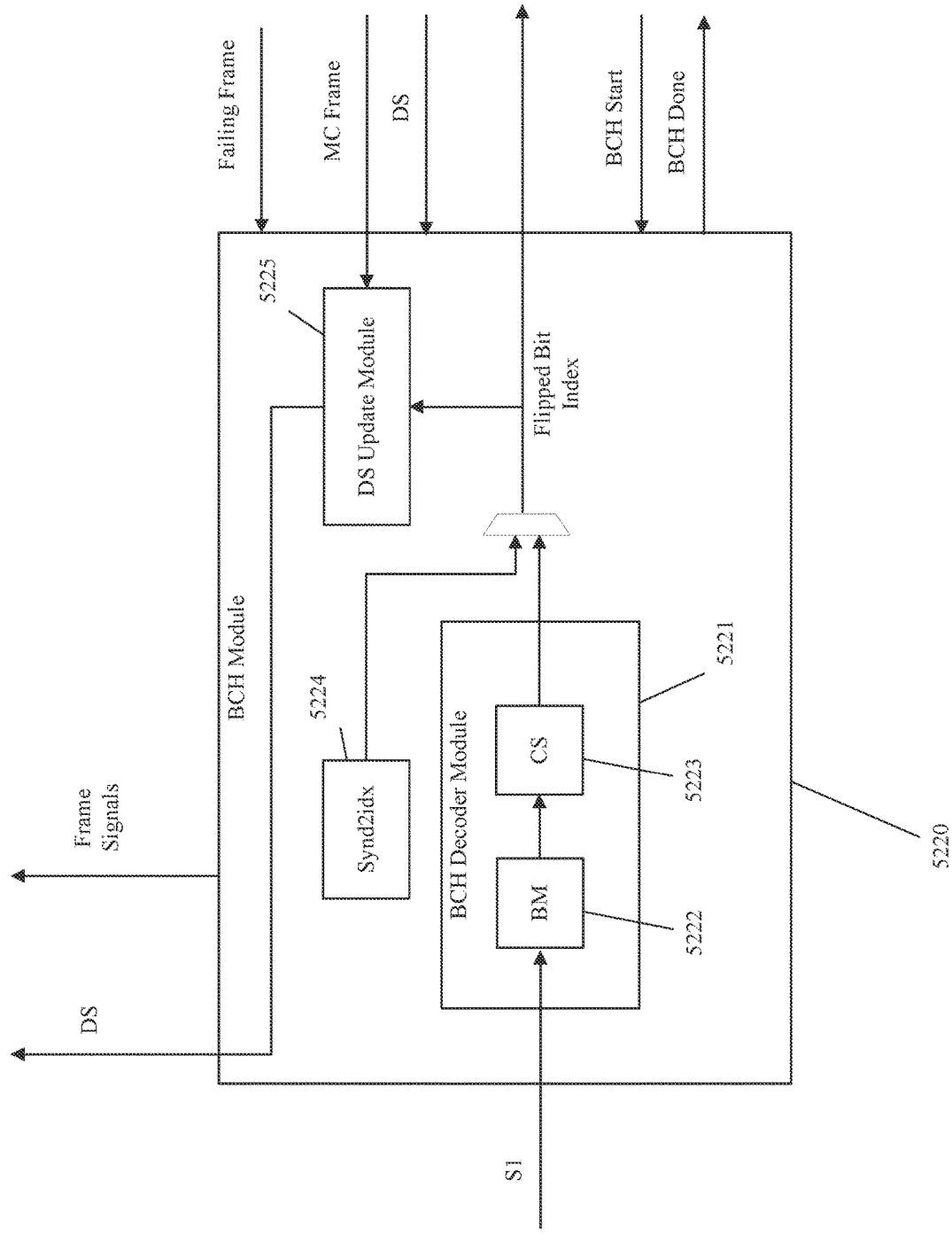
FIG. 5D is a block diagram of a BCH module, according to embodiments.

FIG. 5D is a block diagram of the BCH module 5220, according to embodiments. In embodiments, the BCH module 5220 may include a delta syndrome update module 5225, a BCH decoder module 5221, and a Synd2idx logic 5224.

In embodiments, the BCH module 5220 may manage tasks related to frame decoding. For example, the BCH module 5220 may manage the frames to be decoded, which may be for example only failing frames, may activate BCH decoder module 5221 according to the decoding stage and failing frames, may perform the BCH decoding of frames, for example using one of BCH decoder module 5221 and Synd2idx logic 5224, and perform delta-syndrome calculations, for example using delta syndrome update module 5225, based on determine flipped bits or receiving an indication that an MC frame has been detected. In embodiments, the BCH module 5220 may use Synd2idx logic 5224 to perform the BCH decoding at stage 0, and may use BCH decoder module 5221 at higher stages, however embodiments are not limited thereto.

When the BCH module 5220 receives a "start" pulse, for example using the BCH start signal from the SBCH control module 5210, the failing frames signal received from the SBCH control module 5210, which may include for example a failing frames vector indicating failing frames, may be considered to be valid. Based on the failing frames signal, the BCH module 5220 may scan the failing frames vector for failing frames to send, for example, to BCH decoder module 5221. A value of t may be set by the SBCH control module 5210 according to a decoding stage and, for example, a desired mode of operation, and may be provided to BCH module 5220. The BCH decoder module 5221 may perform BCH decoding and may output t indexes to flip (unless the BCH decoder process fails), and delta syndromes may be calculated using delta syndrome update module 5225 and provided, for example using delta syndrome signal DS, to the RSS control module 5232 in order to update the appropriate RSS.

In embodiments, Synd2idx logic 5224 may include table which may be used to perform BCH decoding, for example in a case of single error correction (t=1), to increase throughput.

In embodiments, the BCH decoder module 5221 may include two algorithmic blocks, for example BM module 5222, which may perform the BM algorithm as discussed above, and the CS module 5223, which may perform the CS algorithm as discussed above. In embodiments, several indexes might be output from the CS module 5223 on the same cycle, but they may be processed by the delta syndrome update module one-by-one. The BCH syndrome used by the BCH decoder module 5221, which may be for example the channel syndrome S1, may be received from the SBCH control module 5210, and may represents the noise syndrome.

Delta syndromes may be calculated for flipped bits in two cases. For example, the delta syndromes may be calculated when the BCH decoding is determined to be correct, and flipped bits detected by the BCH decoder module 5221, for example based on an output of the CS module 5223. As another example, the delta syndromes may be calculated when an MC frame is reverted, and flipped bits of the MC frame, which may be detected by RS decoding, are invalidated from the flipped bit list 5214 and their contribution to RSS calculation are canceled.

In embodiments, the delta syndromes may be calculated per flipped bit, using a table, which may be for example a look-up table (LUT), and may be referred to for example as a table idx2synd, or a multiplication of 2 "table" results. As an example, the first syndrome, S1, may be calculated using a table. The syndrome S3 may be derived from $S3=S1*S2=S1*S1^2$. To reduce area, the next syndrome may be be $S5=S1*S1^4$. The syndrome S7 may not be capable of being derived from two "table results", and therefore a table may be defined for S7. The table or the recursive calculation may be selected based on the required timing, for example 1 cycle. In embodiments, a single multiplier following a table may be allowed, and a square operation may be negligible.

In embodiments, the BCH decoder module 5221 may provide frame signals to the RS module 5230. In embodiments, these frame signal may include signals indicating information about a frame that is decoded by the BCH decoder module 5221, including a signal indicating a frame index, a signal indicating that a frame is done, or a signal indicating that a frame has passed, or decoded successfully.

Figure 5E:
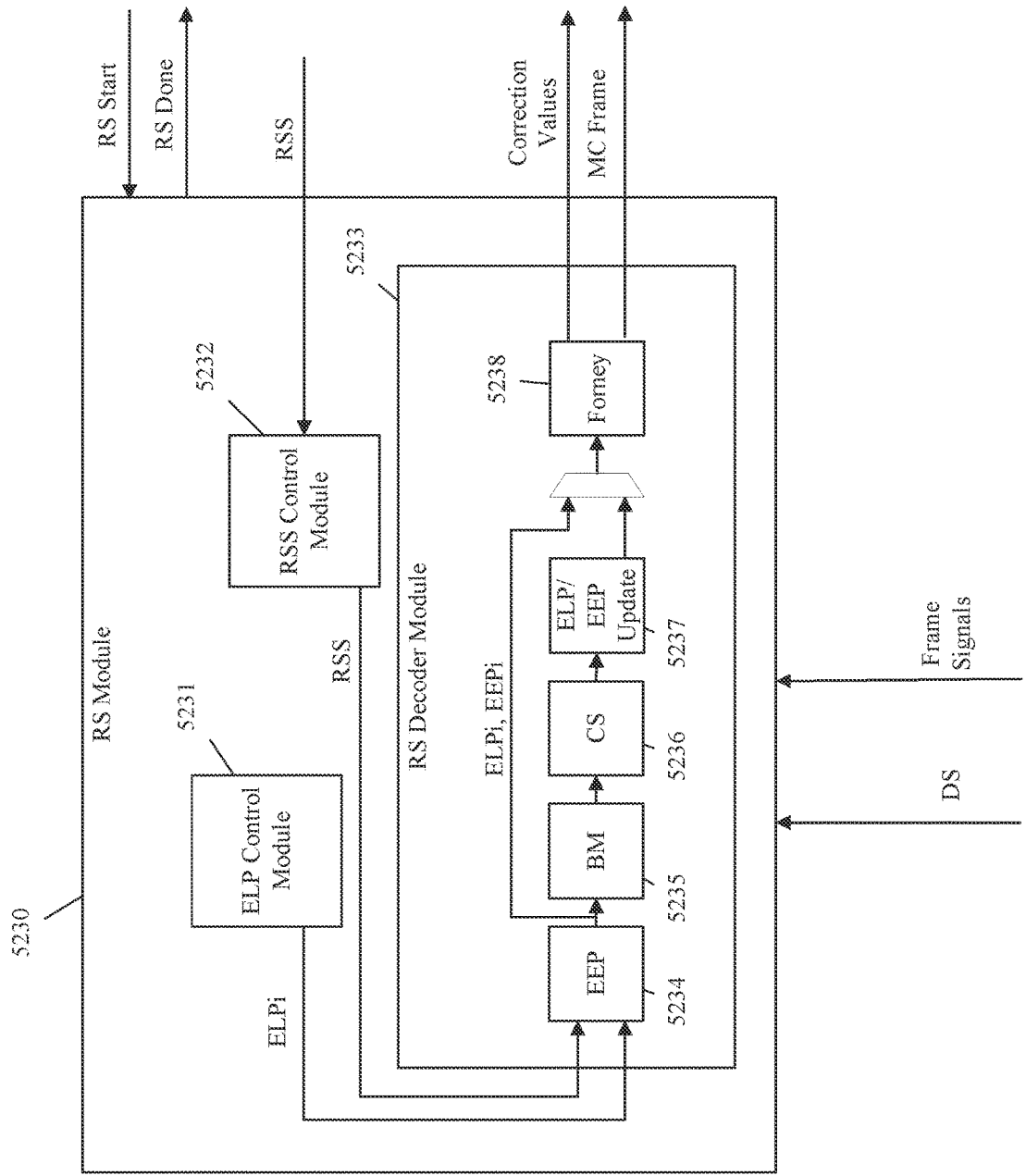
FIG. 5E is a block diagram of an RS module, according to embodiments.

FIG. 5E is a block diagram of the RS module 5230, according to embodiments. In embodiments, the RS module 5230 may include an ELP control module 5231, an RSS control module 5232, and an RS decoder module 5233.

In embodiments, the ELP control module 5231 may be responsible for maintaining and updating ELPi, which may be an initial ELP. An initial ELP may be calculated by multiplies of root monomials. For each failing frame j, which may be for example scanned and decoded by the BCH module 5220, the ELP may be multiplied by the monomial $(1+\alpha_j x)$. In embodiments, a hardware implementation of this operation may include a multiplexer for $\alpha_j$, f1 Galois field multipliers, and m*f1 XOR gates. In embodiments, for area optimization, this hardware may be shared with EEP module 5234 in RS decoding, as it operates at different times.

In embodiments, the RSS control module 5232 may be responsible for maintaining and updating an RSS, for example an RSS for the current decoding stage At a beginning of the decoding process, the RSS control module 5232 may load channel RSS values supplied by, for example, the input buffer 5400, the RSS buffer 5160, or the SBCH control module 5210. For every successfully decoded frame, delta syndrome values, for example provided from the BCH module 5220 using the delta syndrome signal DS, may be used to update the RSS. For a miscorrected frame, SBCH control module 5210 may delete the frame's flipped indexes from the flipped bit list, and the BCH module 5220 may re-send the calculated delta syndromes, for example using the delta syndrome signal DS. RSS update is similar to case of success. In the case of successful RS decoding, the relevant column will become zeroes.

In embodiments, the RS decoder module 5233 may starts with RSS and ELP already calculated. An EEP module 5234 may use the RSS and ELP to determine an EEP and detect errors. A discussed above, if errors are detected by the EEP module, a BM, CS, ELP, and EEP update is performed by a BM update module 5235, a CS update module 5236, and an EEP/ELP update module 5237, respectively. A Forney algorithm is then used by Forney module 5238 to correct delta syndromes corresponding to the detected errors, and identify MC frames.

Figure 6A:
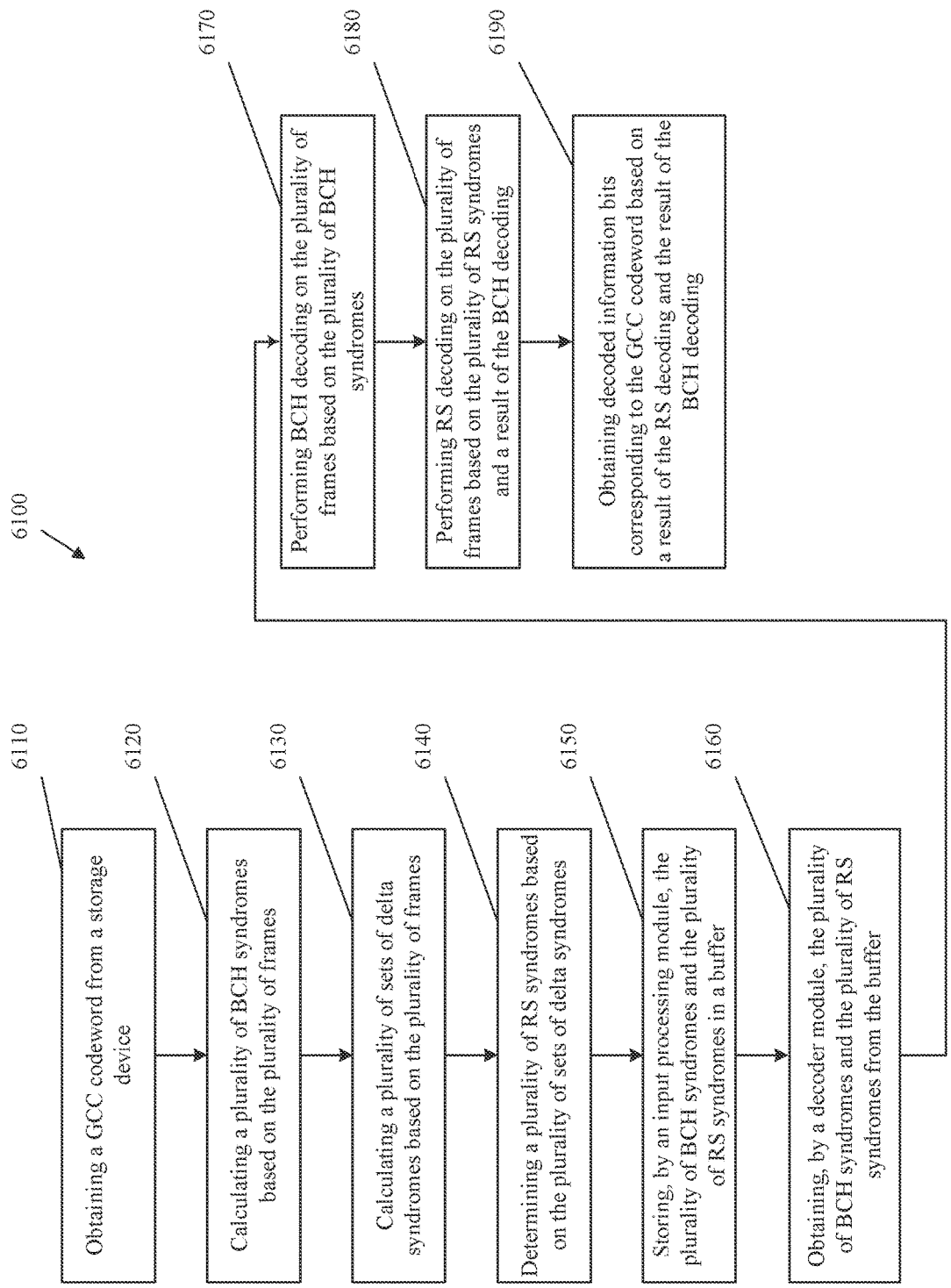
FIG. 6A-6C are flowcharts of processes of controlling storage systems, according to embodiments.

FIG. 6A is a flowchart of a process 6100 of controlling a storage system, according to embodiments. In some implementations, one or more process blocks of FIG. 6A may be performed by memory system 1000, or any other element described herein, for example decoder 105, decoder 5000, or any elements included in the decoder 105 or the decoder 5000.

As shown in FIG. 6A, at operation S6110 the process 6100 may include obtaining, by an input processing module implemented by the at least one processor, a GCC codeword from a storage device, wherein the GCC codeword may include a plurality of frames arranged according to a SBCH coding scheme. In embodiments, the input processing module may correspond to input processing module 5100, and the storage device may correspond to memory system 1000 or memory device 110.

As further shown in FIG. 6A, at operation S6120 the process 6100 may include calculating, by the input processing module, a plurality of BCH syndromes based on the plurality of frames.

As further shown in FIG. 6A, at operation S6130 the process 6100 may include calculating, by the input processing module, a plurality of sets of delta syndromes based on the plurality of frames.

As further shown in FIG. 6A, at operation S6140 the process 6100 may include determining, by the input processing module, a plurality of Reed-Solomon (RS) syndromes based on the plurality of sets of delta syndromes.

As further shown in FIG. 6A, at operation S6150 the process 6100 may include storing, by the input processing module, the plurality of BCH syndromes and the plurality of RS syndromes in a buffer. In embodiments, the buffer may correspond to input buffers 5400, channel syndrome buffer 5150, or RS S buffer 5160, or any combination thereof.

As further shown in FIG. 6A, at operation S6160 the process 6100 may include obtaining, by a decoder module implemented by the at least one processor, the plurality of BCH syndromes and the plurality of RS syndromes from the buffer. In embodiments, the decoder module may correspond to the decoder module 5200.

As further shown in FIG. 6A, at operation S6170 the process 6100 may include performing, by the decoder module, BCH decoding on the plurality of frames based on the plurality of BCH syndromes.

As further shown in FIG. 6A, at operation S6180 the process 6100 may include performing, by the decoder module, RS decoding on the plurality of frames based on the plurality of RS syndromes and a result of the BCH decoding.

As further shown in FIG. 6A, at operation S6190 the process 6100 may include obtaining, by an output processing module implemented by the at least one processor, decoded information bits corresponding to the GCC codeword based on a result of the RS decoding and the result of the BCH decoding. In embodiments, the output processor module may correspond to output processing module may correspond to output processing module 5300

In embodiments, according to the SBCH encoding, the GCC codeword may include a plurality of rows and a plurality of columns, each row of the plurality of rows may include a BCH codeword, and at least one column of the plurality of columns may include an RS codeword.

In embodiments, a BCH syndrome from among the plurality of BCH syndromes may be calculated based on a frame from among the plurality of frames, and a set of delta syndromes from among the plurality of sets of delta syndromes may be calculated based on the frame.

Figure 6B:
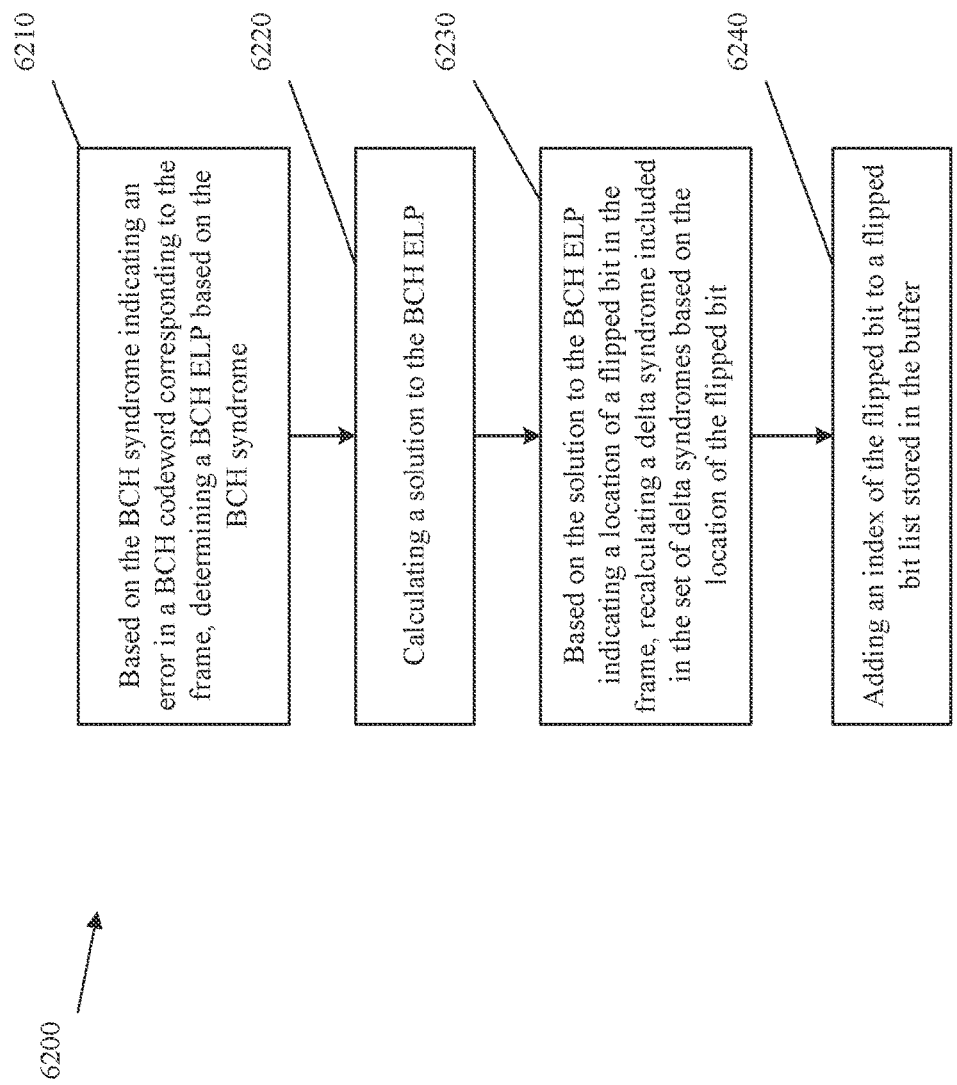

FIG. 6B is a flowchart of a process 6200 of controlling a storage system, according to embodiments. In some implementations, one or more process blocks of FIG. 6B may be performed by memory system 1000, or any other element described herein, for example decoder 105, decoder 5000, or any elements included in the decoder 105 or the decoder 5000.

In embodiments, one or more process blocks of process 6200 may be performed after process blocks of process 6100.

As shown in FIG. 6B, at operation 6210 the process 6200 may include based on the BCH syndrome indicating an error in a BCH codeword corresponding to the frame, determining, by a BCH decoder, a BCH error locator polynomial (ELP) for the BCH codeword based on the BCH syndrome. In embodiments, the BCH decoder may correspond to the BCH module 5220.

As further shown in FIG. 6B, at operation 6220 the process 6200 may include calculating, by the BCH decoder, a solution to the BCH ELP.

As further shown in FIG. 6B, at operation 6230 the process 6200 may include based on the solution to the BCH ELP indicating a location of a flipped bit in the frame, recalculating, by the BCH decoder, a delta syndrome included in the set of delta syndromes based on the location of the flipped bit.

As further shown in FIG. 6B, at operation 6240 the process 6200 may include based on the solution to the BCH ELP indicating the location of the flipped bit in the frame, adding, by the BCH decoder module, an index of the flipped bit to a flipped bit list stored in the buffer. In embodiments, the flipped bit list may correspond to flipped bit list 5214.

In embodiments, the BCH ELP may be determined using a Berlekamp-Massey algorithm, and the solution to the BCH ELP may be calculated using a Chien search algorithm.

Figure 6C:
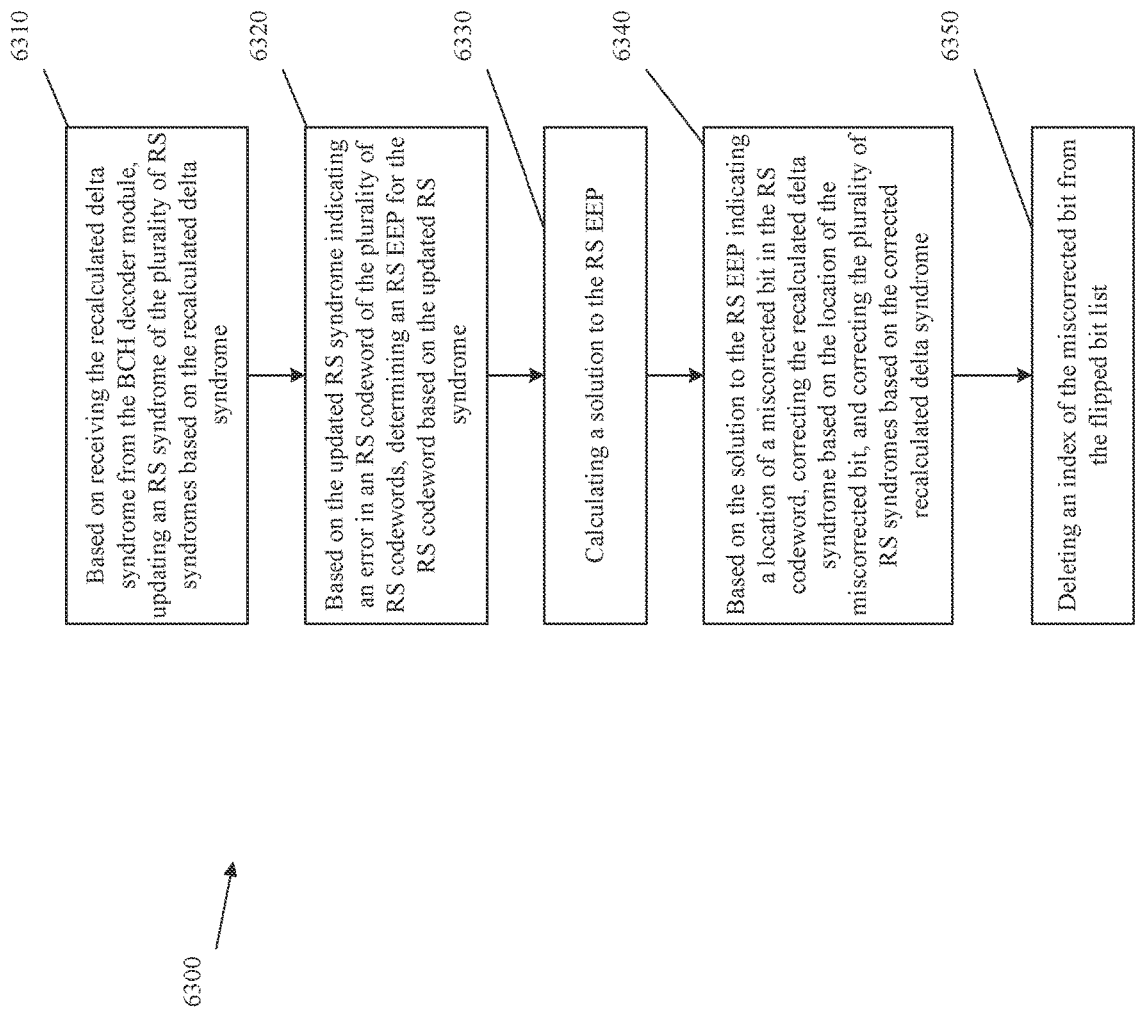

FIG. 6C is a flowchart of a process 6300 of controlling a storage system, according to embodiments. In some implementations, one or more process blocks of FIG. 6C may be performed by memory system 1000, or any other element described herein, for example decoder 105, decoder 5000, or any elements included in the decoder 105 or the decoder 5000.

In embodiments, one or more process blocks of process 6300 may be performed after process blocks of process 6200.

As shown in FIG. 6C, at operation 6310 the process 6300 may include based on receiving the recalculated delta syndrome from the BCH decoder module, updating an RS syndrome of the plurality of RS syndromes based on the recalculated delta syndrome.

As further shown in FIG. 6C, at operation 6320 the process 6300 may include based on the updated RS syndrome indicating an error in an RS codeword of the plurality of RS codewords, determining, by the RS decoder module, an RS error evaluator polynomial (EEP) for the RS codeword based on the updated RS syndrome. In embodiments, the RS decoder module may correspond to the RS module 5230.

As further shown in FIG. 6C, at operation 6330 the process 6300 may include calculating, by the RS decoder module, a solution to the RS EEP.

As further shown in FIG. 6C, at operation 6340 the process 6300 may include based on the solution to the RS EEP indicating a location of a miscorrected bit in the RS codeword, correcting, by the RS decoder module, the recalculated delta syndrome based on the location of the miscorrected bit, and correcting the plurality of RS syndromes based on the corrected recalculated delta syndrome.

As further shown in FIG. 6C at operation 6350 the process 6300 may include based on the solution to the RS EEP indicating the location of the miscorrected bit, deleting, by the RS decoder module, an index of the miscorrected bit from the flipped bit list.

In embodiments, the recalculated delta syndrome may be corrected using a Forney algorithm.

In embodiments, the decoded information bits may be obtained based on the GCC codeword and the flipped bit list.

Although FIGS. 6A-6C show example blocks of the processes 6100-6300, in some implementations, the processes 6100-6300 may include additional blocks, fewer blocks, different blocks, or differently arranged blocks than those depicted in FIGS. 6A-6C. Additionally, or alternatively, two or more of the blocks of the processes 6100-6300 may be arranged or combined in any order, or performed in parallel.

Figure 7:
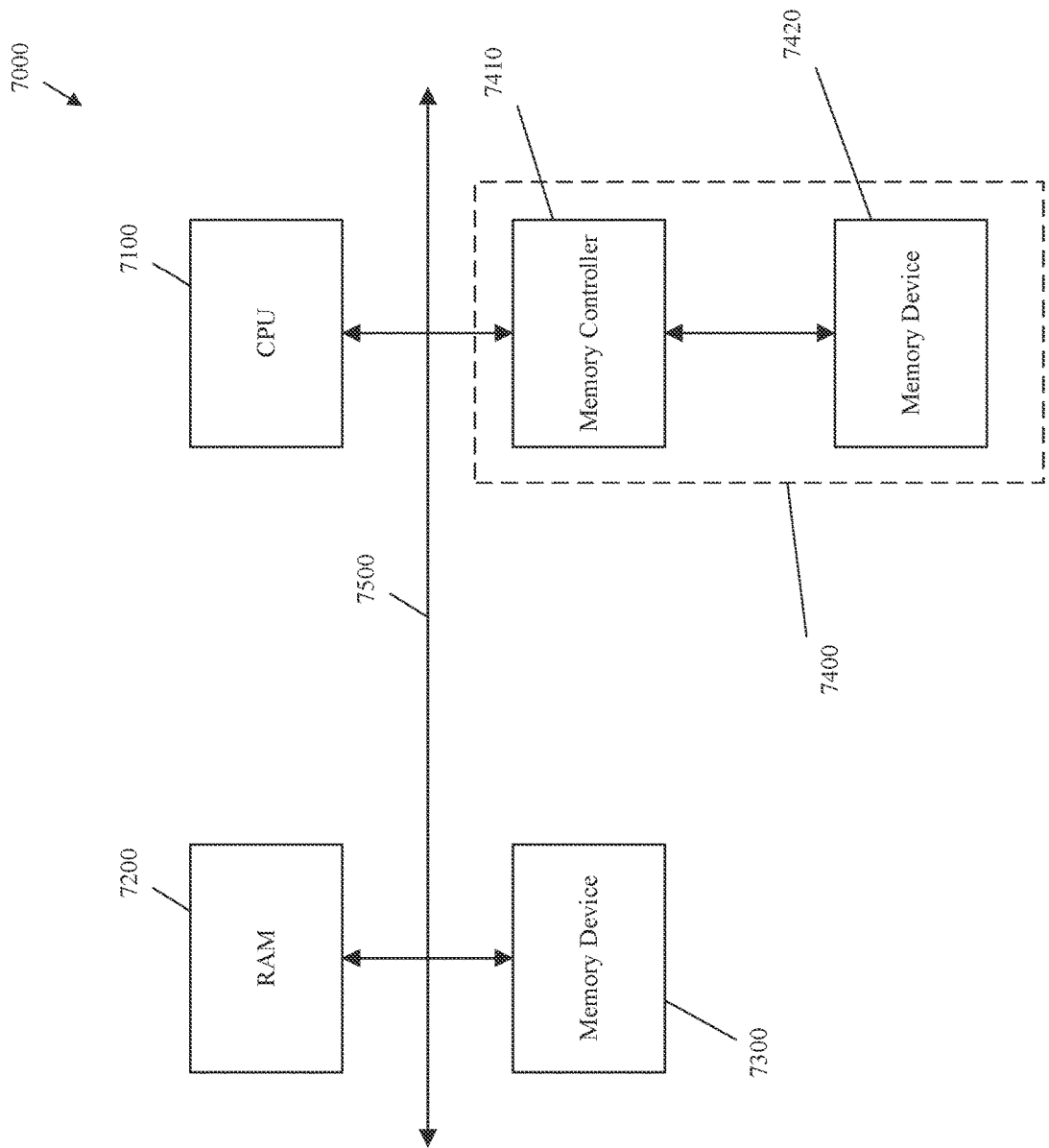
FIG. 7 is a block diagram of a computer system including a memory system according to embodiments.

FIG. 7 is a block diagram of a computer system 7000 including a memory system according to embodiments. The computer system 7000, such as a mobile device, a desktop computer, and a server, may employ a memory system 7400 according to embodiments.

The computer system 7000 may include a central processing unit 7100, a RAM 7200, a user interface 7300, and the memory system 7400, are electrically connected to buses 7500. The host as described above may include the central processing unit 7100, the RAM 7200, and the user interface 7300 in the computer system 7000. The central processing unit 7100 may control the entire computer system 7000 and may perform calculations corresponding to user commands input via the user interface 7300. The RAM 7200 may function as a data memory for the central processing unit 7100, and the central processing unit 7100 may write/read data to/from the memory system 7400.

As in example embodiments described above, the memory system 7400 may include a memory controller 7410 and a memory device 7420. The memory controller 7410 may include an encoder and a decoder, and the memory device 7420 may include a cell array including a plurality of memory cells.

According to embodiments, the memory controller 7410 may be implemented by the memory controller 100 discussed above with reference to FIG. 1, and the memory device 7420 may be implemented by the memory device 110 discussed above with reference to FIG. 1.

Figure 8:
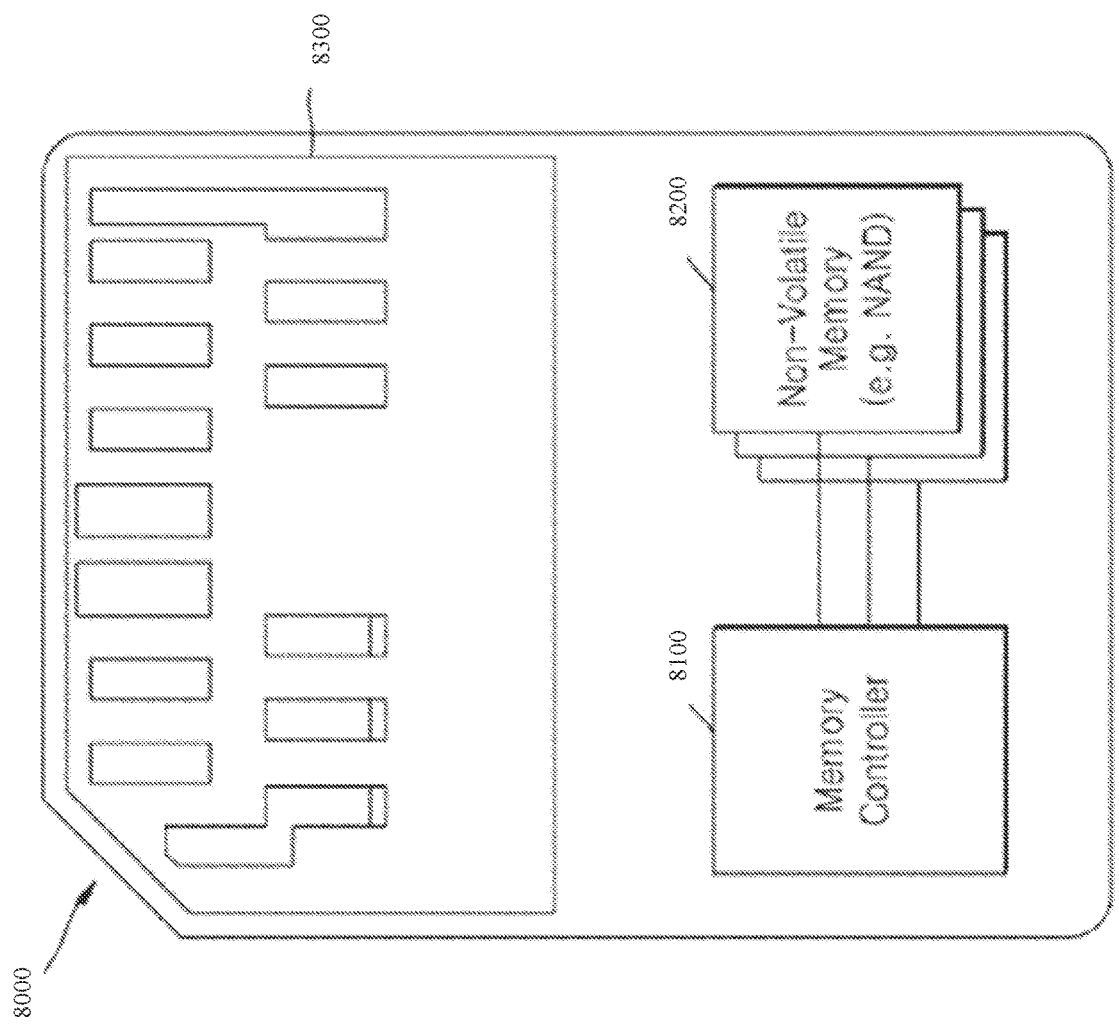
FIG. 8 is a block diagram showing a memory card according to embodiments.

FIG. 8 is a block diagram showing a memory card 8000 according to embodiments. The memory system 1000 according to example embodiments discussed above with reference to FIG. 1 may be the memory card 8000. For example, the memory card 8000 may include an embedded multimedia card (eMMC) or a secure digital (SD) card. As shown in FIG. 8, the memory card 8000 may include a memory controller 8100, a non-volatile memory 8200, and a port region 8300. The memory controller 8100 may be implemented by the processor 101 discussed above with reference to FIG. 1, and the non-volatile memory 8200 shown in FIG. 8 may be implemented by the memory device 110 discussed above with reference to FIG. 1.

The memory controller 8100 may include an encoder and a decoder. The encoder and the decoder may perform an encoding method and a decoding method according to embodiments. In embodiments, the decoder may correspond to, for example, decoder 105, decoder 5000, or any elements included in the decoder 105 or the decoder 5000. The memory controller 8100 may communicate with an external host via the port region 8300 in compliance with a pre-set protocol. The protocol may be eMMC protocol, SD protocol, SATA protocol, SAS protocol, or USB protocol. The non-volatile memory 8200 may include memory cells which retain data stored therein even if power supplied thereto is blocked. For example, the non-volatile memory 8200 may include a flash memory, a magnetic random access memory (MRAM), a resistance RAM (RRAM), a ferroelectric RAM (FRAM), or a phase change memory (PCM).

According to embodiments, memory controller 8100 and non-volatile memory 8200 may be implemented, respectively, by the memory controller 100 and the memory device 110 discussed above with reference to FIG. 1.

Figure 9:
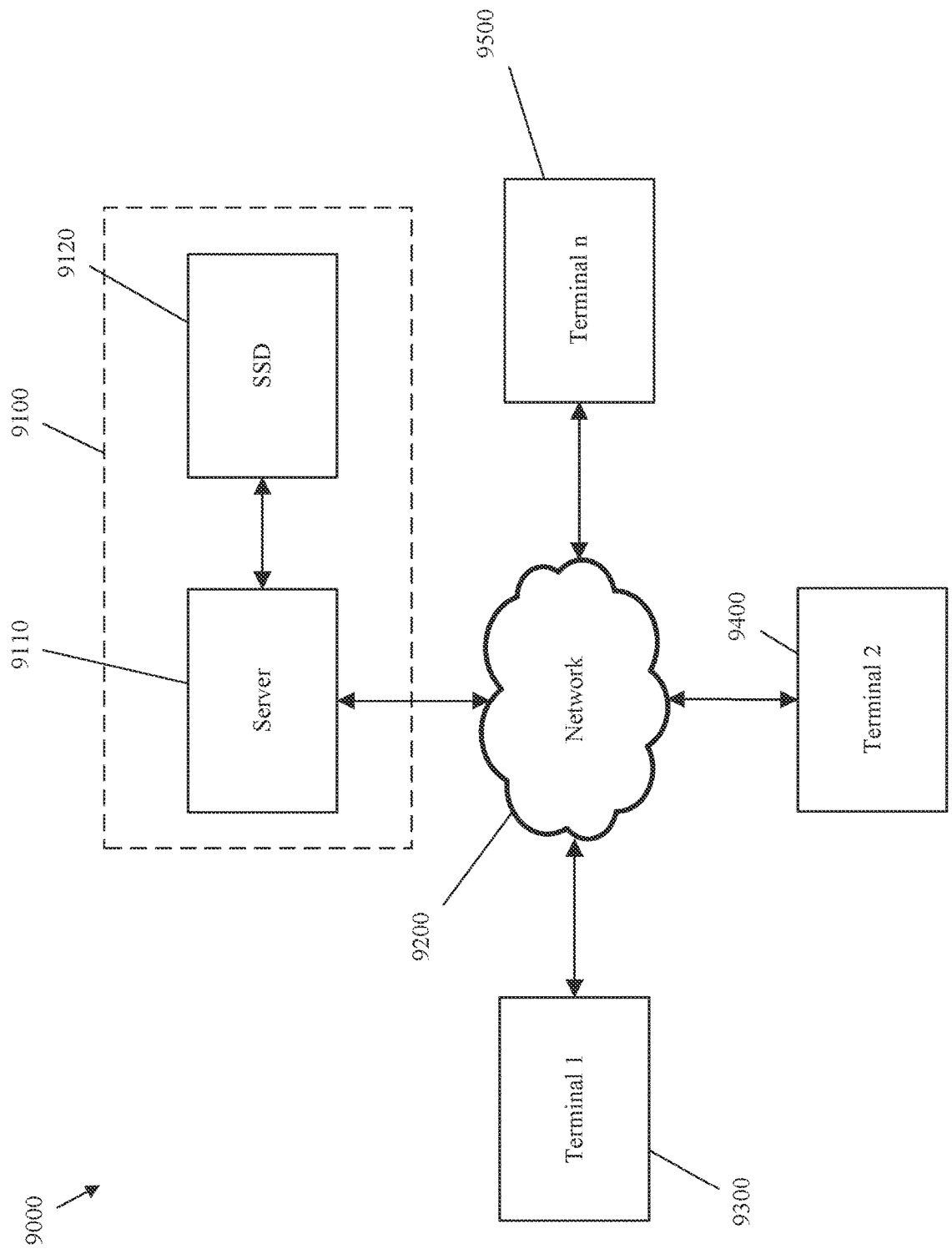
FIG. 9 is a block diagram of a network system including a memory system according to embodiments.

FIG. 9 is a block diagram of a network system 9000 including a memory system according to embodiments. As shown in FIG. 9, the network system 9000 may include a server system 9100 and a plurality of terminals 9300, 9400, and 9500 that are connected via a network 9200. The server system 9100 may include a server 9110 for processing requests received from the plurality of terminals 9300, 9400, and 9500 connected to the network 9200 and an SSD 9120 for storing data corresponding to the requests received from the terminals 9300, 9400, and 9500. Here, the SSD 9120 may be a memory system according to embodiments.

According to embodiments, SSD 9120 may be implemented by the memory system 1000 discussed above with reference to FIG. 1.

As is traditional in the field, the embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the present scope. Further, the blocks, units and/or modules of the embodiments may be physically combined into more complex blocks, units and/or modules without departing from the present scope.

The various operations of methods described above may be performed by any suitable means capable of performing the operations, such as various hardware and/or software component(s), circuits, and/or module(s).

The software may include an ordered listing of executable instructions for implementing logical functions, and can be embodied in any "processor-readable medium" for use by or in connection with an instruction execution system, apparatus, or device, such as a single or multiple-core processor or processor-containing system.

The blocks or steps of a method or algorithm and functions described in connection with the embodiments disclosed herein may be embodied directly in hardware, in a software module executed by a processor, or in a combination of the two. If implemented in software, the functions may be stored on or transmitted over as one or more instructions or code on a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art.

The foregoing is illustrative of the embodiments and is not to be construed as limiting thereof. Although a few embodiments have been described, those skilled in the art will readily appreciate that many modifications are possible in the embodiments without materially departing from the present scope.

What is claimed is:

1. A storage system, comprising:
a storage device configured to store a plurality of generalized concatenated code (GCC) codewords;
a buffer; and
at least one processor configured to implement an input processing module, a decoder module, and an output processing module,
wherein the input processing module is configured to:
obtain a GCC codeword from the storage device, wherein a GCC codeword of the plurality of GCC codewords comprises a plurality of frames arranged according to a Super Bose-Chaudhuri-Hocquenghem (SBCH) coding scheme;
calculate a plurality of Bose-Chaudhuri-Hocquenghem (BCH) syndromes based on the plurality of frames;
calculate a plurality of sets of delta syndromes based on the plurality of frames;
determine a plurality of Reed-Solomon (RS) syndromes based on the plurality of sets of delta syndromes; and
store the plurality of BCH syndromes and the plurality of RS syndromes in the buffer,
wherein the decoder module is configured to:
obtain the plurality of BCH syndromes and the plurality of RS syndromes from the buffer;
perform BCH decoding on the plurality of frames based on the plurality of BCH syndromes; and
perform RS decoding on the plurality of frames based on the plurality of RS syndromes and a result of the BCH decoding, and
wherein the output processing module is configured to obtain decoded information bits corresponding to the GCC codeword based on a result of the RS decoding and the result of the BCH decoding.

2. The storage system of claim 1, wherein according to the SBCH encoding, the GCC codeword comprises a plurality of rows and a plurality of columns,
wherein each row of the plurality of rows comprises a BCH codeword, and
wherein at least one column of the plurality of columns comprises an RS codeword.

3. The storage system of claim 1, wherein a BCH syndrome from among the plurality of BCH syndromes is calculated based on a frame from among the plurality of frames, and
wherein a set of delta syndromes from among the plurality of sets of delta syndromes is calculated based on the frame.

4. The storage system of claim 3, wherein the decoder module further comprises a BCH decoder module configured to perform the BCH decoding, and
wherein based on the BCH syndrome indicating an error in a BCH codeword corresponding to the frame, the BCH decoder module is configured to:
determine a BCH error locator polynomial (ELP) for the BCH codeword based on the BCH syndrome;
calculate a solution to the BCH ELP; and
based on the solution to the BCH ELP indicating a location of a flipped bit in the frame, recalculate a delta syndrome included in the set of delta syndromes based on the location of the flipped bit.

5. The storage system of claim 4, wherein the BCH ELP is determined using a Berlekamp-Massey algorithm, and
wherein the solution to the BCH ELP is calculated using a Chien search algorithm.

6. The storage system of claim 4, wherein the decoder module further comprises an RS decoder module configured to perform the RS decoding,
wherein based on receiving the recalculated delta syndrome from the BCH decoder module, the RS decoder module is configured to update an RS syndrome of the plurality of RS syndromes based on the recalculated delta syndrome, and
wherein based on the updated RS syndrome indicating an error in an RS codeword of the plurality of RS codewords, the RS decoder module is configured to:
determine an RS error evaluator polynomial (EEP) for the RS codeword based on the updated RS syndrome;
calculate a solution to the RS EEP; and
based on the solution to the RS EEP indicating a location of a miscorrected bit in the RS codeword, correct the recalculated delta syndrome based on the location of the miscorrected bit, and correct the plurality of RS syndromes based on the corrected recalculated delta syndrome.

7. The storage system of claim 6, wherein the recalculated delta syndrome is corrected using a Forney algorithm.

8. The storage system of claim 6, wherein based on the solution to the BCH ELP indicating the location of the flipped bit in the frame, the BCH decoder module is further configured to add an index of the flipped bit to a flipped bit list stored in the buffer, and
wherein based on the solution to the RS EEP indicating the location of the miscorrected bit, the RS decoder module is further configured to delete an index of the miscorrected bit from the flipped bit list.

9. The storage system of claim 8, wherein based on the result of the BCH decoding indicating that all frames of the plurality of frames are correct, and a result of the BCH decoding indicating that all RS codewords of the plurality of RS codewords are correct, the output processing module is further configured to obtain the decoded information bits based on the GCC codeword and the flipped bit list.

10. A device for decoding a generalized concatenated code (GCC) codeword, the device comprising:
a buffer; and
at least one processor configured to:
obtain the GCC codeword, wherein the GCC codeword comprises a plurality of frames encoded according to an inner coding scheme and arranged as a plurality of rows, and each column of a plurality of columns corresponding to the plurality of rows is encoded according to an outer coding scheme;
calculate a plurality of inner syndromes based on the plurality of frames, wherein the plurality of inner syndromes correspond to the inner coding scheme;
calculate a plurality of sets of delta syndromes based on the plurality of frames;
determine a plurality of outer syndromes based on the plurality of sets of delta syndromes, wherein the plurality of outer syndromes correspond to the outer coding scheme;
store the plurality of inner syndromes and the plurality of outer syndromes in a buffer;
perform inner decoding on the plurality of frames according to the inner coding scheme based on the plurality of inner syndromes stored in the buffer;
update at least one outer syndrome of the plurality of outer syndromes stored in the buffer based on a result of the inner decoding; and
perform outer decoding on the plurality of frames according to the outer coding scheme based on the updated at least one outer syndrome; and
obtain decoded information bits corresponding to the GCC codeword based on a result of the inner decoding and the result of the outer decoding.

11. The device of claim 10, wherein the inner coding scheme is a Bose-Chaudhuri-Hocquenghem (BCH) coding scheme, the plurality of inner syndromes comprises a plurality of BCH syndromes, and the inner decoding comprises BCH decoding,
wherein the outer coding scheme is a Reed-Solomon (RS) coding scheme, the plurality of outer syndromes comprises a plurality of RS syndromes, and the outer decoding comprises RS decoding, and
wherein the GCC codeword is encoded according to a Super BCH (SBCH) coding scheme.

12. The device of claim 11, wherein a BCH syndrome from among the plurality of BCH syndromes is calculated based on a frame from among the plurality of frames, and wherein a set of delta syndromes from among the plurality of sets of delta syndromes is calculated based on the framed.

13. The device of claim 12, wherein based on the BCH syndrome indicating an error in a BCH codeword corresponding to the frame, the at least one processor is further configured to:
determine a BCH error locator polynomial (ELP) for the BCH codeword based on the BCH syndrome;
calculate a solution to the BCH ELP; and
based on the solution to the BCH ELP indicating a location of a flipped bit in the frame, recalculate a delta syndrome included in the set of delta syndromes based on the location of the flipped bit.

14. The device of claim 13, wherein based on the recalculated delta syndrome, the at least one processor is further configured to:
update an RS syndrome of the plurality of RS syndromes based on the recalculated delta syndrome; and
based on the updated RS syndrome indicating an error in an RS codeword of the plurality of RS codewords:
determine an RS error evaluator polynomial (EEP) for the RS codeword based on the updated RS syndrome;
calculate a solution to the RS EEP; and
based on the solution to the RS EEP indicating a location of a miscorrected bit in the RS codeword, correct the recalculated delta syndrome based on the location of the miscorrected bit, and correct the plurality of RS syndromes based on the corrected recalculated delta syndrome.

15. A method of controlling a storage system, the method being executed by at least one processor and comprising:
obtaining, by an input processing module implemented by the at least one processor, a generalized concatenated code (GCC) codeword from a storage device, wherein the GCC codeword comprises a plurality of frames arranged according to a Super Bose-Chaudhuri-Hocquenghem (SBCH) coding scheme;
calculating, by the input processing module, a plurality of Bose-Chaudhuri-Hocquenghem (BCH) syndromes based on the plurality of frames;
calculating, by the input processing module, a plurality of sets of delta syndromes based on the plurality of frames;
determining, by the input processing module, a plurality of Reed-Solomon (RS) syndromes based on the plurality of sets of delta syndromes; and storing, by the input processing module, the plurality of BCH syndromes and the plurality of RS syndromes in a buffer;

obtaining, by a decoder module implemented by the at least one processor, the plurality of BCH syndromes and the plurality of RS syndromes from the buffer;

performing, by the decoder module, BCH decoding on the plurality of frames based on the plurality of BCH syndromes;

performing, by the decoder module, RS decoding on the plurality of frames based on the plurality of RS syndromes and a result of the BCH decoding; and obtaining, by an output processing module implemented by the at least one processor, decoded information bits corresponding to the GCC codeword based on a result of the RS decoding and the result of the BCH decoding.

16. The method of claim 15, wherein according to the SBCH encoding, the GCC codeword comprises a plurality of rows and a plurality of columns, wherein each row of the plurality of rows comprises a BCH codeword, and wherein at least one column of the plurality of columns comprises an RS codeword.

17. The method of claim 15, wherein a BCH syndrome from among the plurality of BCH syndromes is calculated based on a frame from among the plurality of frames, and wherein a set of delta syndromes from among the plurality of sets of delta syndromes is calculated based on the frame.

18. The method of claim 17, wherein the decoder module further comprises a BCH decoder module, and wherein based on the BCH syndrome indicating an error in a BCH codeword corresponding to the frame, the method further comprises:

determining, by the BCH decoder, a BCH error locator polynomial (ELP) for the BCH codeword based on the BCH syndrome;

calculating, by the BCH decoder, a solution to the BCH ELP; and based on the solution to the BCH ELP indicating a location of a flipped bit in the frame, recalculating, by the BCH decoder, a delta syndrome included in the set of delta syndromes based on the location of the flipped bit.

19. The method of claim 17, wherein the BCH ELP is determined using a Berlekamp-Massey algorithm, and wherein the solution to the BCH ELP is calculated using a Chien search algorithm.

20. The method of claim 18, wherein the decoder module further comprises an RS decoder module, wherein based on receiving the recalculated delta syndrome from the BCH decoder module, the method further comprises updating an RS syndrome of the plurality of RS syndromes based on the recalculated delta syndrome, and wherein based on the updated RS syndrome indicating an error in an RS codeword of the plurality of RS codewords, the method further comprises:

determining, by the RS decoder module, an RS error evaluator polynomial (EEP) for the RS codeword based on the updated RS syndrome;

calculating, by the RS decoder module, a solution to the RS EEP; and based on the solution to the RS EEP indicating a location of a miscorrected bit in the RS codeword, correcting, by the RS decoder module, the recalculated delta syndrome based on the location of the miscorrected bit, and correcting the plurality of RS syndromes based on the corrected recalculated delta syndrome.

* * * * *